US007787575B2

(12) United States Patent
Dawson et al.

(10) Patent No.: US 7,787,575 B2
(45) Date of Patent: Aug. 31, 2010

(54) METHOD AND SYSTEM FOR WIDE-RANGE SYNCHRONIZATION TO ALTERNATING CURRENT POWER SIGNALS

(76) Inventors: Francis P. Dawson, c/o The Edward S. Rogers Sr. Dept. of Electrical and Computer Engineering, University of Troronto, 10 King's College Road, Toronto, Ontario (CA) M5S 3G4; Hamid Shokrollah Timorabadi, 114-200 Wellesley Street East, Toronto, Ontario (CA) M4X 1G3

( * ) Notice: Subject to any disclaimer, the term of this patent is extended or adjusted under 35 U.S.C. 154(b) by 934 days.

(21) Appl. No.: 11/387,937

(22) Filed: Mar. 24, 2006

(65) Prior Publication Data

US 2006/0215064 A1    Sep. 28, 2006

Related U.S. Application Data

(60) Provisional application No. 60/664,701, filed on Mar. 24, 2005.

(51) Int. Cl.
*H04L 7/00* (2006.01)
(52) U.S. Cl. .................. 375/354; 327/147; 327/156; 327/306; 331/172; 342/103; 363/40; 375/215; 375/294; 375/327; 375/373; 375/376; 388/911
(58) Field of Classification Search .................. 327/306
See application file for complete search history.

(56) References Cited

U.S. PATENT DOCUMENTS

2002/0097080 A1* 7/2002 Freitag et al. ............... 327/306

OTHER PUBLICATIONS

Ludeman (Nonlinear formulas for interpolation, extrapolation, and estimation of single and multiple sinusoids; Apr. 3-6, 1990; pp. 2607-2610; vol. 5).*
A. Karimi-Ziarani, "Extraction of Non-stationary Sinusoids," Ph.D. Thesis, University of Toronto, Toronto, Canada, 2002.
M. Karimi-Ghartemani, "A Synchronization Scheme Based on an Enhanced Phase-Locked Loop System", Ph.D. Thesis, University of Toronto, Toronto, Canada, 2004.
M. Kariml-Gharternani, and a, karirni-ziarani, "Periodic Orbit Analysis of Two Dynamical Systems for Electrical Engineering Applications", Journal of Engineering Mathematics, vol. 45, No. 2, pp. 135.154, Feb. 2003.

(Continued)

*Primary Examiner*—David C Payne
*Assistant Examiner*—Adolf Dsouza
(74) *Attorney, Agent, or Firm*—Bingham McCutchen LLP

(57) ABSTRACT

A method and system for synchronizing an input signal for a power system. The method comprises: extracting from the input signal, three substantially equidistant samples from a fundamental component of the input signal; determining a frequency ($f_1$), an amplitude ($A_1$), and a phase-difference ($\Phi_{Diff}$) of the input signal from the three equidistant samples and a tracking signal corresponding to a steady-state of the fundamental component of the input signal characterized by a frequency ($f_{TS}$) and an amplitude ($A_{TS}$) with a phase-difference that is the phase angle between the tracking signal and the input signal; and generating and outputting a frequency, amplitude, and phase-difference signals corresponding to the determined frequency ($f_1$), amplitude ($A_1$), and phase-difference ($\Phi_{Diff}$) of the input signal to one or more components of the power system.

24 Claims, 19 Drawing Sheets

OTHER PUBLICATIONS

S. Pavljasevic, "Synchronization to Disturbed AC Utility Network Signals in Power Electronics Applications", Ph.D. Thesis, University of Toronto, Toronto, Canada, 2002.

B, P. McGrath, D. G. Holrnes, and J. Galloway, "Improved Power Converter Line Synchronization Using an Adaptive Discrete Fourier Transform (DFT)", Power Electronics Specialists Conference, pesc, IEEE 334d Annual, vol. 2, pp. 23-27, Jun. 23-27, 2002.

S. K. Chung, "A Phase Tracking System for Three Phase Utility Interface Inverters", Power Electronics, IEEE Transactions on, vol. 15, Issue: 3, pp. 431-438, May 2000.

S. K. Chung, "Phase-Locked Loop for Grid-Connected Three-Phase Power Conversion Systems", Electric Power Applications, IEEE Proceedings, vol. 147, Issue: 3, pp. 21 3-21 9, May 2000.

L. N. Arruda, B. J. Cardosa Filho, S. M. Silva, S. R. Silva, and A. S, A. C. Diniz, "Wide Bandwidth Single and Three-Phase PLL Structures for Grid-Tied PV Systems", Photovoltaic Specialists Conference, Conference Record of the Twenty-Eighth IEEE, pp. 1660-1 663, Sep. 15-22, 2000.

S. J. Lee, J. K. Kang, and S. K. Sul, "A New Phase Detecting Method for Power Conversion Systems Considering Distorted Conditions in Power System", Industry Applications Conference, Thirty-Fourth IAS Annual Meeting, Conference Record of the 1999 IEEE, vol. 4, pp. 2167-2172 vol. 4, Oct. 3-7, 1999.

Data Sheet, "MCt4046B, Phase Locked Loop", Motorola.

Application notes, "Configuring and Applying the MC74HC4046A Phase-Locked Loop", Motorola.

M. K. Fellah, J. F. Aubry, P. Wang, and C. Zanne, "Digital Synchronization System for the Control of Self-Controlled Synchronous Machine Converters", CRAN, Groupe, AUREL, ENSEM—INPL, 2, Avenue de la foret de Haye, 54516, Vandoeuvre-Les-Nancy, France.

American National Standard, TI-523-2001.

TMS320C3 User's Guide, Texas Instruments, Literature No. SPRU03 1 F, 2558539-9761 revision L, Mar. 2004.

Development Kit User Guide, "Manual No. NT107-0132", Nallatech, Issue: 9, 2003.

\* cited by examiner (a) Sharp transition edge.  (b) Shallow transition edge.

METHOD AND SYSTEM FOR WIDE-RANGE SYNCHRONIZATION TO ALTERNATING CURRENT POWER SIGNALS

RELATED APPLICATIONS

This application is a regular U.S. patent application and claims priority to U.S. provisional patent application No. 60/664,701 filed Mar. 24, 2005.

FIELD OF THE APPLICATION

The present application relates to the field of signal processing, and more particularly, to a method and system for wide-range synchronization to alternating current (AC) power signals for use in power systems.

BACKGROUND

Synchronization is a requirement in many power systems and power electronics applications that require monitoring and control of a device or system. The synchronization information which includes frequency, amplitude, and phase angle with respect to a reference frame are typically used in control applications to improve the supply of the electric power to the end users. The synchronization information must also be capable of being immune to harmonics, inter-harmonics, wideband stationary/non-stationary noise, and notch-type disturbances.

The need for synchronization information is not restricted to utility networks where frequency is 50/60 Hz with a range of ±5 Hz. The need also expands to non-utility applications such as the aerospace industry where the frequency is 400 Hz and can vary in the range of 360-800 Hz.

There are currently a number of methods for the extraction of synchronization information. Five of these existing methods are described below with reference to several of the following documents, which are incorporated herein by reference:

[1] A. Karimi-Ziarani, "Extraction of Non-stationary Sinusoids," Ph.D. Thesis, University of Toronto, Toronto, Canada, 2002;
[2] M. Karimi-Ghartemani, "A Synchronization Scheme Based on an Enhanced Phase-Locked Loop System", Ph.D. Thesis, University of Toronto, Toronto, Canada, 2004;
[3] M. Karimi-Ghartemani, and A. Karimi-Ziarani, "Periodic orbit analysis of two dynamical systems for electrical engineering applications", Journal of Engineering Mathematics, Volume: 45, Number: 2, pp. 135-154, February 2003;
[4] S. Pavljasevic, "Synchronization to Disturbed AC Utility Network Signals in Power Electronics Applications", Ph.D. Thesis, University of Toronto, Toronto, Canada, 2002;
[5] B. P. McGrath, D. G. Holmes, and J. Galloway, "Improved Power Converter Line Synchronization Using an Adaptive Discrete Fourier Transform (DFT)", Power Electronics Specialists Conference, pesc, IEEE 33rd Annual, Volume: 2, Pages: 23-27, 23-27 Jun. 2002;
[6] S. K. Chung, "A phase tracking system for three phase utility interface inverters", Power Electronics, IEEE Transactions on, Volume: 15, Issue: 3, Pages: 431-438, May 2000;
[7] S. K. Chung, "Phase-locked loop for grid-connected three-phase power conversion systems", Electric Power Applications, IEE Proceedings, Volume: 147, Issue: 3, Pages: 213-219, May 2000;
[8] L. N. Arruda, B. J. Cardoso Filho, S. M. Silva, S. R. Silva, and A. S. A. C. Diniz, "Wide bandwidth single and three-phase PLL structures for grid-tied PV systems", Photovoltaic Specialists Conference, Conference Record of the Twenty-Eighth IEEE, Pages: 1660-1663, 15-22 Sep. 2000;
[9] S. J. Lee, J. K. Kang, and S. K. Sul, "A new phase detecting method for power conversion systems considering distorted conditions in power system", Industry Applications Conference, Thirty-Fourth IAS Annual Meeting, Conference Record of the 1999 IEEE, Volume: 4, Pages: 2167-2172 vol. 4, 3-7 Oct. 1999;
[10] Data sheet, "MC14046B, Phase Locked Loop", Motorola, http://www.onsemi.com/home;
[11] Application notes, "Configuring and Applying the MC74HC4046A Phase-Locked Loop", Motorola, http://www.onsemi.com/home;
[12] M. K. Fellah, J. F. Aubry, P. Wan, and C. Zanne, "Digital synchronization system for the control of self-controlled synchronous machine converters", CRAN, Groupe, AUREL, ENSEM-INPL, 2, Avenue de la foret de Haye, 54516, Vandoeuvre-Les-Nancy, France;
[13] American National Standard, ET1.523-2001, available at http://www.its.bldrdoc.gov/projects/devglossary;
[14] TMS320C31 User's Guide, Texas Instruments, Literature number: SPRU031E 2558539-9761 revision L, July 1997; and,
[15] Development Kit User Guide, "Manual Number: NT107-0132", Nallatech, Issue: 9, 2003, available at http://www.nallatech.com.

Enhanced Phase Locked Loop. The algorithm introduced in [1] and [2] is based on a phase locked loop (PLL) architecture and determines the amplitude, phase angle, and frequency of the dominant component of an input signal. The mathematical relations require knowledge of constant values ($\mu_1$, $\mu_2$, and $\mu_3$) that determine the gains for different operations such as the integrator modules in the algorithm. The choice of $\mu_1$, $\mu_2$, and $\mu_3$ is critical in terms of influencing the performance of the algorithm and is typically optimized for a pre-selected operating point, i.e. 60 Hz. Moreover, $\mu_1$, $\mu_2$, and $\mu_3$ do not maintain the optimized values as the frequency of the dominant component changes. The algorithm performance depends on the choice of $\mu_1$, $\mu_2$, and $\mu_3$. For instance, a larger $\mu_1$ results in a faster response time while degrading the resolution of the EPLL. An approximate assessment of the algorithms performance is summarized below based on the information provided in references [1-3]: a nominal frequency of 50/60 Hz; a frequency range of 20-120 Hz; and, a transient response time of 6 cycles based on the nominal frequency value.

Multirate Phase Locked Loop. A digital implementation of the synchronization system based on a multirate phase locked loop (MPLL) is provided in [4]. The MPLL operates with two different sampling rates. One sampling rate is called fast sample rate (v) and is higher than the input signal frequency. The other is equal to the input signal frequency and is referred to as the slow sample rate (f). The slow sample rate is related to the fast sample rate by $$N = \frac{v}{f}, \qquad (1)$$

where N is the number of samples per cycle. During the time the input signal frequency changes, a PLL error is generated that consequently changes the fast sample rate accordingly and hence the MPLL achieves phase synchronization. The response time of the MPLL to a 1 Hz step frequency perturbation exceeds 600 msec (over 36 cycles of a 60 Hz signal). Furthermore, the response time is in the order of seconds for a 4 Hz step frequency change from 60 Hz to 64 Hz. The long delay time is a direct result of the tradeoff that exists between the dynamic response and noise immunity of the MPLL. A performance summary of the algorithm is provided below: a nominal frequency of 50/60 Hz; a frequency range of 48-72 H; and, a slow response time in the order of seconds.

Adaptive Fourier Transform for Synchronization. The study presented in reference [5] considers zero crossing synchronization for power converter applications using a recursive digital Fourier transform (DFT). The recursive DFT approach causes phase differences due to mismatches between the DFT time window and the system period. This method achieves a faster response time to frequency or phase transients than the MPLL [4] and EPLL [3]. A performance summary of the algorithm based on the data provided in references [5] follows: a nominal frequency of 50/60 Hz; a limited frequency range of approximately ±10 Hz for a 50/60 Hz utility system; and, a transient response time of approximately 4 cycles of the nominal frequency.

Three-Phase Phase Locked Loop. A three-phase PLL method for a balanced three-phase system that consists of a phase detector and a loop filter is reported in [6-8]. The phase detection is designed using a dq-transformation frame. The loop filter consists of a PI regulator that generates a phase error employed by a voltage controlled oscillator (VCO). The design of the loop filter involves a trade off between the dynamic performance and filtering of undesired distortion on the input signals. The loop filter requires a low bandwidth to become effective in filtering input signals superimposed with harmonics and/or DC-offset. The low bandwidth results in a poor dynamic response. In the presence of a voltage unbalance on the three-phase utility lines, a positive sequence detector is combined with the three-phase PLL that can eliminate the effects of unbalance [9]. The positive sequence detector employed in [9] is not frequency adaptive and hence can only operate over a limited frequency range. The performance of the three-phase PLL is summarized as follows: poor dynamic response due to a low bandwidth implementation of loop filter; and, lack of frequency adaptability.

Analog Phase Locked Loop. Another method for phase synchronization is to use an analog phase locked loop (PLL). This scheme is available in the form of integrated chips from Motorola, among other manufacturers [10, 11]. The shortcomings of the analog PLL are as follows: Inability to synchronize to disturbed signals; typically a high order front-end filter is required to alleviate this concern but the filter is complex and is subject to temperature drift and component tolerances. In addition, a high order filter introduces long delay times and gives rise to a slow transient response, inability to perform frequency tracking, and sensitivity to online noise.

In view of the foregoing disadvantages, there exists a need for an improved synchronization method and system for power systems.

SUMMARY

The present application provides a wide-range synchronization system for applications in utility and non-utility power systems and power electronics.

According to one aspect of the present application, there is provided a method for synchronizing an input signal for a power system, comprising:

extracting from the input signal, three substantially equidistant samples from a fundamental component of the input signal;

determining a frequency ($f_1$), an amplitude ($A_1$), and a phase-difference ($\Phi_{Diff}$) of the input signal from the three equidistant samples and a tracking signal corresponding to a steady-state of the fundamental component of the input signal characterized by a frequency ($f_{TS}$) and an amplitude ($A_{TS}$) with a phase-difference that is the phase angle between the tracking signal and the input signal; and generating and outputting a frequency, amplitude, and phase-difference signals corresponding to the determined frequency ($f_1$), amplitude ($A_1$), and phase-difference ($\Phi_{Diff}$) of the input signal to one or more components of the power system.

According to another aspect of the present application, there is provided a synchronization system, comprising: a processor operably connect to a memory for storing data and instructions, the processor being configured to:

extract from the input signal, three substantially equidistant samples from a fundamental component of the input signal;

determine a frequency ($f_1$), an amplitude ($A_1$), and a phase-difference ($\Phi_{Diff}$) of the input signal from the three equidistant samples and a tracking signal corresponding to a steady-state of the fundamental component of the input signal characterized by a frequency ($f_{TS}$) and an amplitude ($A_{TS}$) with a phase-difference that is the phase angle between the tracking signal and the input signal; and generate and outputting a frequency, amplitude, and phase-difference signals corresponding to the determined frequency ($f_1$), amplitude ($A_1$), and phase-difference ($\Phi_{Diff}$) of the input signal to one or more components of the power system.

These and other aspects and features of the present application will become apparent to persons of ordinary skill in the art upon review of the following detailed description, taken in combination with the appended drawings.

BRIEF DESCRIPTION OF THE DRAWINGS

It will be noted that throughout the appended drawings, like features are identified by like reference numerals except as otherwise indicated.

DETAILED DESCRIPTION OF THE PREFERRED EMBODIMENTS

Overview

Figure 1:
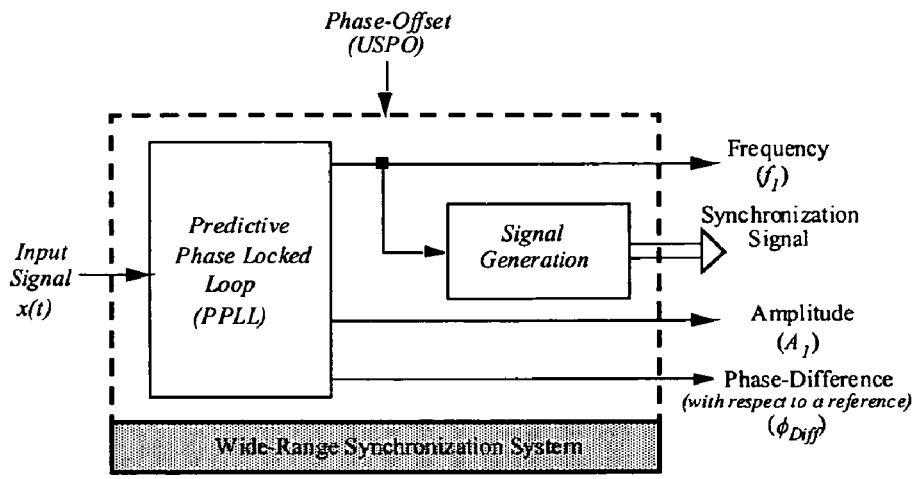
FIG. 1 is a block diagram of a wide-range synchronization system (WSS) according to one embodiment of the present application.

The present application provides a wide-range synchronization system for applications in utility and non-utility power systems and power electronics.

The wide-range synchronization system is based on a predictive phase locked loop (PPLL) concept. The PPLL is fully adaptive in extracting time variant synchronization information from an input signal. The fundamental component of the input signal is extracted in the form of three equidistant samples using a fundamental sample extractor. The synchronization information includes frequency, amplitude, and phase angle with respect to a reference frame that can be altered so as to allow a real-time phase offset implementation. The PPLL can extract the synchronization information from the input signal over a wide range of frequency and amplitude in the presence of disturbances.

Two methods are provided to extract the synchronization information: a transformed method and a sequential method. The strengths of each method are exploited so as to achieve high execution speed and low real estate utilization.

According to some embodiments, the operating range for frequency and amplitude are from a fraction of Hz to a few kHz and from 4% to 100% of nominal amplitude respectively. The synchronization information may be extracted within two cycles of the input signal period under most realistic perturbations in frequency, amplitude, and/or phase angle. The synchronization method seeks to provide a faster, more flexible method that is capable of operating over a wider range of amplitudes and frequencies, and which is more robust than currently available methods.

The present application describes a synchronization system comprised of logic modules integrated to form algorithms. In particular, the application provides a robust and flexible solution for synchronization to a power AC signal with frequencies ranging from sub-seconds to several kHz. Current approaches to synchronization are not based on any standards, are not robust, and are designed for restricted operating conditions. Moreover, the performance metrics for existing designs are difficult to determine due to a lack of any knowledge regarding the system's capabilities.

The present application also seeks to provide a hardware architecture optimized for frequency range, amplitude range, speed of response, noise immunity and frequency tracking performance. Also, a phase shift offset feature has been provided to allow users to accommodate phase shifts that are external to the system. The design is compact and can be constructed with standard logic modules.

The present application also describes methods and system that use synchronous sampling, predictive phase locked loops, and algorithms that compute the amplitude, phase, and frequency of the fundamental component explicitly. A synchronously sampled finite impulse response filter that is re-initialized once per cycle is used to provide noise immunity without substantially compromising tracking performance. The described embodiments seek to allow users to incorporate the algorithms for building faster more robust synchronization systems. The synchronization system has been optimized for speed of response, amplitude range, frequency range and noise immunity. The system can be constructed with a small number of gates and hence the silicon real estate consumed is small and the power dissipation is low.

According to one embodiment, the wide-range synchronization system (WSS) can extract synchronization information such as frequency, amplitude, and phase angle with respect to a reference frame from a single-phase input signal. The WSS can also extract synchronization information from a three-phase system by locking to the positive sequence component of the input signal. The WSS comprises a digital predictive phase locked loop (PPLL) that is modeled on the basis of two analytical methods: a transformed method and a sequential method. The transformed method offers a decoupled approach in terms of computing frequency, amplitude, and phase angle but requires many iterations which lead to longer execution times. The sequential method is a coupled approach that requires simple mathematical operations. However, the sequential method computes the synchronization information in three consecutive steps: frequency, followed by phase, followed by amplitude. This sequential computation of the synchronization information does not allow parallel processing and thus the execution speed suffers. Preferably, the preferred features of the transformed and sequential methods are selected and combined in the PPLL.

The WSS offers a user-specified phase-offset (USPO) that introduces a phase offset relative to a desired synchronization reference-point (RP) on the input fundamental component period. The USPO enables the user to dynamically offset the reference-point with respect to the initial selected reference-point while the WSS is operational. For example, it may be of interest to correct for phase shift introduced by components such as a transformer upstream from the WSS.

The WSS method can be implemented with a microprocessor or with a field programmable gate array (FPGA). The FPGA implementation allows a gate level design as well as parallel processing and hence increases execution speed. The WSS can extract the synchronization information from an input signal with a wide range of frequency (from approximately a fraction of a Hz to 2 kHz or more in some embodiments) and amplitude (from approximately 4% to 100% of the nominal value in some embodiments), superimposed with noise (up to 60% of the amplitude of the fundamental component of the input signal in some embodiments).

In some embodiments, the tracking properties of the WSS exhibit a two cycle response time under worst case conditions. Existing designs do not have such a wide frequency range, wide amplitude range, noise immunity, fast response time or have the ability to provide an adaptive phase shifting capability.

Two analytical methods for modeling the PPLL and extracting synchronization formation are provided in the present application as follows: (a) transformed method and (b) sequential method. Both methods use three samples that are positioned at 120° intervals with respect to each other. The three 120° samples are referred to as a three-sample cosine-wave. The transformed method is based on dqz-transformation frame. The transformed method requires iterations for the computation of frequency. The sequential method is also based on the three-sample cosine-wave. The sequential method does not require any iteration, however, the extraction of synchronization information is achieved in the following order: frequency followed by phase angle, followed by amplitude.

The present application also provides a predictive phase locked loop (PPLL). The PPLL is similar to a PLL architecture in the sense that the PPLL locks on to the phase of the input signal, however the functionality of the PPLL differs from conventional PLL architecture in the analytical expressions employed for computing the frequency, amplitude, and phase-difference, which lead to a faster execution speed amongst other advantages.

The WSS and PPLL of the present application can be used as a measurement unit substituting the present phasor measurement units (PMUs) to provide synchronized phasor information. The WSS and PPLL can also be used to produce synchronization signals that can be incorporated in an arc fault detection algorithm, and to provide variable sample rate frequency adaptive signal processing algorithms.

Architecture

The design of a wide-range synchronization system (WSS) based on a predictive phase locked loop (PPLL) will now be described. The term "wide-range" signifies the capability of the system to respond to a wide range of changes in the input signal. The WSS may be used to extract the synchronization information from an input signal with the following characteristics:

Frequency—from approximately zero to a few hundreds of Hertz;

Amplitude—from approximately zero up to a rated value; and,

Phase (with respect to a reference frame)—from approximately zero to a few degrees, superimposed with the following undesired signals:

Wideband stationary/non-stationary noise,

Harmonics/inter-harmonics, and

Impulse or notch type disturbances.

Referring now to FIG. 1, one embodiment of a wide-range synchronization system (WSS) will be described. The WSS comprises a predictive phase locked loop (PPLL) and a signal generation module. There are two input signals to the WSS: an input signal (x(t)) that is an AC voltage or current signal, and a user-specified phase-offset (USPO).

Input Signal. The synchronization information is extracted from voltage and/or current of the power system. Ideally the incoming signal is a sinusoidal waveform $s_1(t)$ defined as follows $$s_1(t)=A_1 \cdot \cos(2 \cdot \pi f_1 \cdot t - \Phi_{Diff}) \qquad (2)$$

where $A_1$ and $f_1$ are the amplitude and frequency of the input fundamental component respectively and $\Phi_{Diff}$ is the phase-difference that is the phase value with respect to a reference frame.

Unfortunately, undesired signals may be superimposed on $s_1(t)$ and hence the input signal (x(t)) is defined as $$x(t)=s_1(t)+n(t), \qquad (3)$$

where n(t) is the undesired component.

Figure 2:
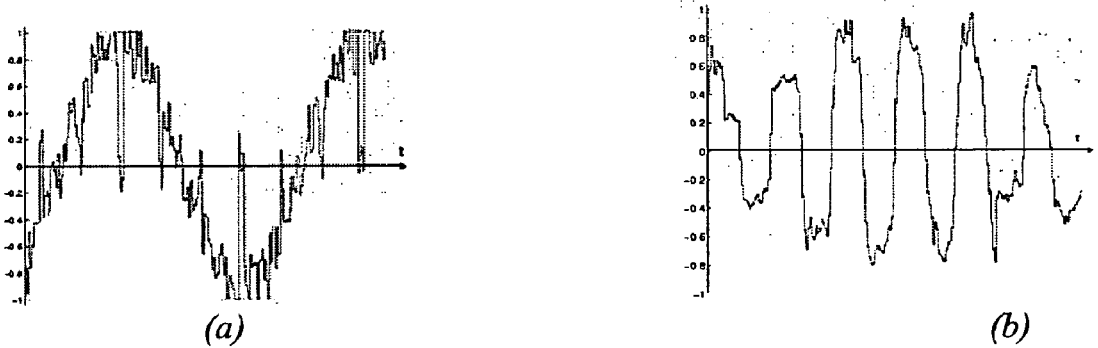
FIG. 2 illustrates two examples of highly contaminated input signals: (a) a signal with notch-type disturbance and noise and (b) an arc furnace voltage waveform.

FIG. 2 illustrates two examples of highly contaminated input signals: (a) a signal with notch-type disturbance and noise and (b) an arc furnace voltage waveform.

Figure 3:
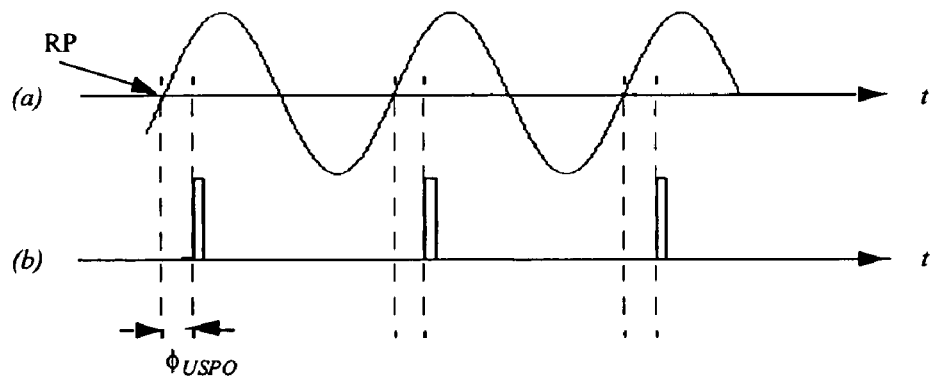
FIG. 3 illustrates: (a) a pure sinusoidal input signal and (b) a generated synchronization signal with a $\Phi_{USPO} \approx 45°$ with respect to the positive zero crossing reference-point (RP)

User-Specified Phase-Offset. The user-specified phase-offset (USPO) is a phase offset relative to a selected synchronization reference-point (RP) on the input fundamental component period. For instance, FIG. 3 shows a USPO ($\Phi_{USPO}$≈45°) with respect to the positive zero crossing reference-point. The reference-point (RP) can be selected arbitrarily at some point on the input fundamental component period, however, a positive/negative zero crossing or peak value are the most convenient. The USPO enables the designer to dynamically offset the reference-point with respect to the selected reference-point while the WSS is operational. For example, it may be of interest to correct for phase shift introduced by components upstream from the WSS such as a transformer.

The WSS generates four output signals. Three of these signals represent the following attributes of the input fundamental component:

Frequency($f_1$),

Amplitude ($A_1$), and

Phase-Difference ($\Phi_{Diff}$) that is the phase value with respect to a reference frame.

The fourth output signal is called a synchronization signal and is generated by the signal generation module. The synchronization signal is aligned with the reference-point (RP).

Figure 4:
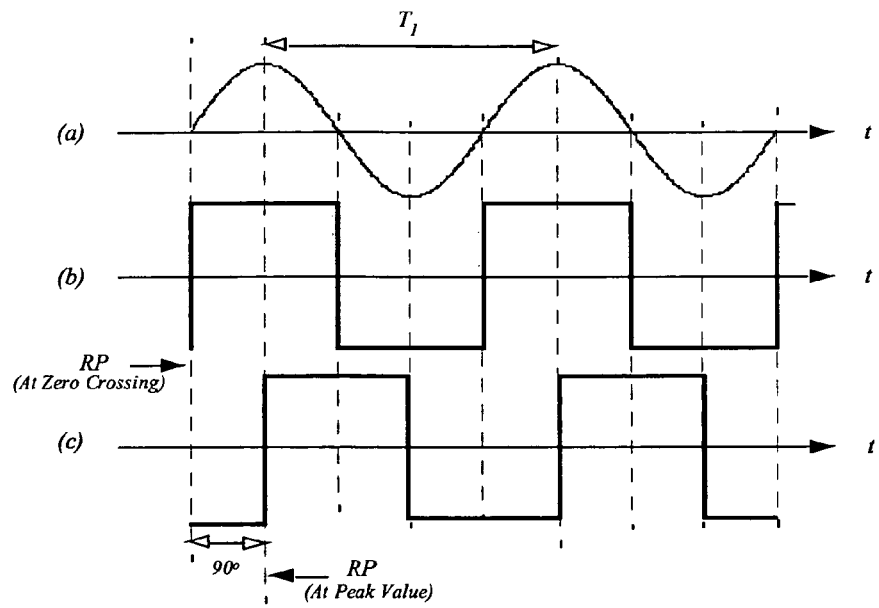
FIG. 4 illustrates: (a) a pure sinusoidal input signal, and synchronization signals aligned with (b) the positive zero crossing, and (c) the positive peak value.

FIG. 4 shows (a) a pure sinusoidal input signal, and (b) and (c) illustrate the resultant synchronization signals for a RP taken at a positive zero crossing and a positive peak respectively. The positive peak reference-point is chosen due to computational constraints that are discussed below.

Predictive Phase Locked Loop (PPLL)

The predictive phase locked loop (PPLL) determines the frequency ($f_1$), amplitude ($A_1$) and phase-difference ($\Phi_{Diff}$) of the input signal. The phase-difference is defined as the phase of the input fundamental component with respect to a reference frame. The time taken for the PPLL to determine $f_1$, $A_1$, and $\Phi_{Diff}$ from the input signal is defined as the prediction period.

Figure 6:
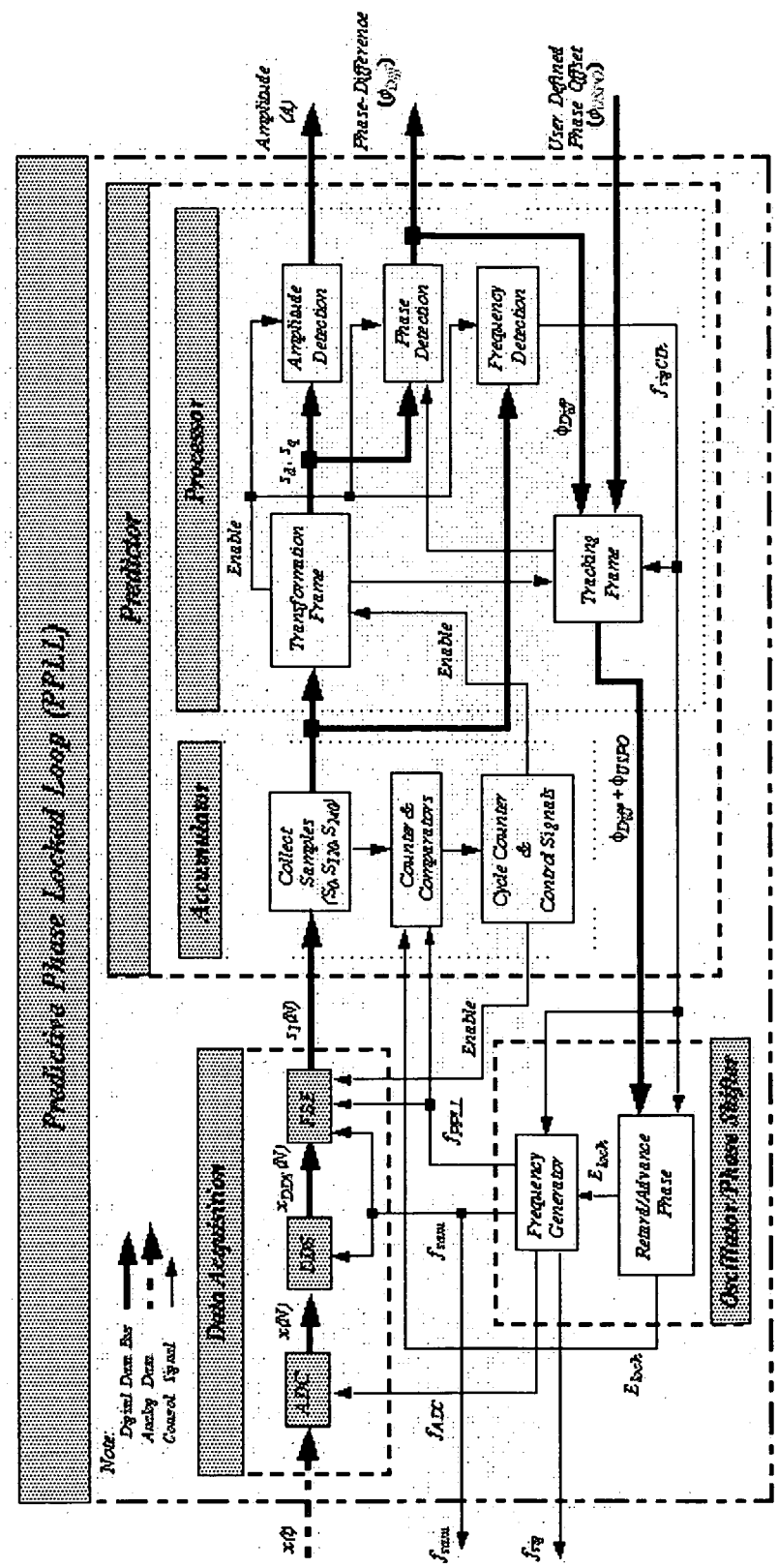
FIG. 6 is a detailed block diagram of a predictive phase locked loop (PPLL) according to one embodiment of the present application.

Referring to FIG. 6, a block diagram of a PPLL according to one embodiment of the applications will described. The PPLL comprises a data acquisition module, a predictor, and an oscillator/phase-shifter. A summary of notations employed in FIG. 6 is provided in the following table.

| SYMBOL | DESCRIPTION |
| --- | --- |
| $f_1$ | Frequency of input fundamental component |
| $A_1$ | Amplitude of input fundamental component |
| $\Phi_{Diff}$ | Phase-Difference between tracking signal and input fundamental component |
| $f_{sam}$ | Sampling frequency |
| $f_{PPLL}$ | PPLL frequency |
| x(t) | Input signal |
| x(N) | Sampled input signal |
| $x_{ADS}$(N) | Down-sampled input signal |
| $s_1$(N) | Three 120°-samples |
| $\Phi_{USPO}$ | The value of user-specified phase-offset |
| $s_d$ | Direct component |
| $s_q$ | Quadrature component |
| $E_{lock}$ | Enable signal from retard/advance sub-module |

The PPLL comprises a data acquisition module, a predictor module, and an oscillator/phase-shifter module. The PPLL generates a signal denoted as a tracking signal that is an exact duplicate of the input fundamental component when the system is in steady state (i.e. identical frequency, amplitude, and phase). Under disturbance conditions, the frequency, amplitude, and/or phase variations of the input signal are detected by the PPLL and then the tracking signal is adjusted to match the input fundamental component.

The tracking signal is the reference frame used to determine the phase of the input fundamental component. The phase between the fundamental component and the tracking signal reference frame is defined as phase-difference and shown by the symbol $\Phi_{Diff}$.

The tracking signal can have an arbitrary phase offset ($\Phi_{USPO}$). The tracking signal ($S_{TS}(t)$) is defined by the following expression:

$$S_{TS}(t) = A_{TS} \cdot \cos(2\pi f_{TS} \cdot t - \Phi_{USPO}),\qquad(4)$$

where $A_{TS}$ and $f_{TS}$ are the magnitude and frequency of the tracking signal respectively.

The following conditions apply during steady state (i.e. when the input fundamental component and the tracking signal overlap):

$$\begin{vmatrix} f_{TS} = f_1 \\ A_{TS} = A_1 \\ \phi_{Diff} = 0 \end{vmatrix}.$$

Consequently, (4) becomes equal to (2) if $\Phi_{USPO}$ is considered zero and hence the tracking signal represents a duplicate of the input fundamental component.

Figure 5:
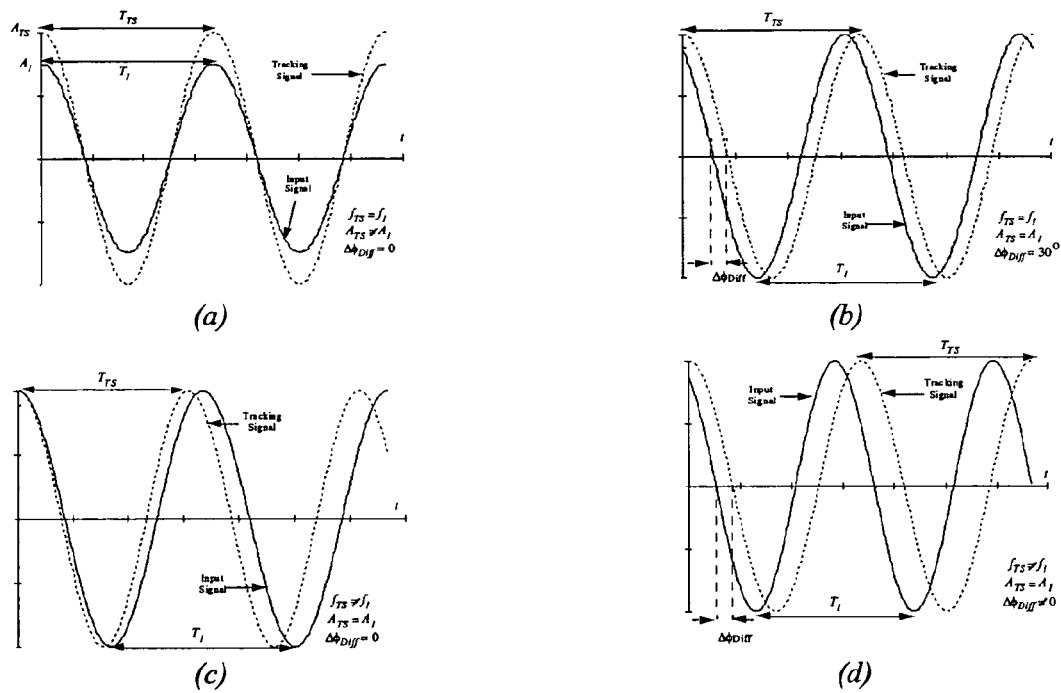
FIG. 5 illustrates a tracking signal and the input fundamental component under different conditions: (a) $A_{TS} \neq A$, (b) $\Phi_{Diff} = 30°$, (c) $f_{TS} > f_1$, and (d) $f_{TS} \neq f_1$ and $\Phi_{Diff} \neq 0$.

During a disturbance or transient, $f_1$, $A_1$, and/or $\Phi_{Diff}$ can change and therefore the tracking signal is no longer synchronized to the input fundamental component. FIG. 5 illustrates the relative position of the tracking signal with respect to the position of the input fundamental component for a select set of perturbations.

Predictor Module

The predictor collects three samples per period of the input signal and then computes $f_1$, $A_1$, and $\Phi_{Diff}$ of the input fundamental component. The triplet ($f_1$, $A_1$, and $\Phi_{Diff}$) is referred to as "synchronization information". The predictor utilizes the synchronization information to generate the tracking signal. The predictor consists of an accumulator and processor modules that are described as follows.

Accumulator

Figure 7:
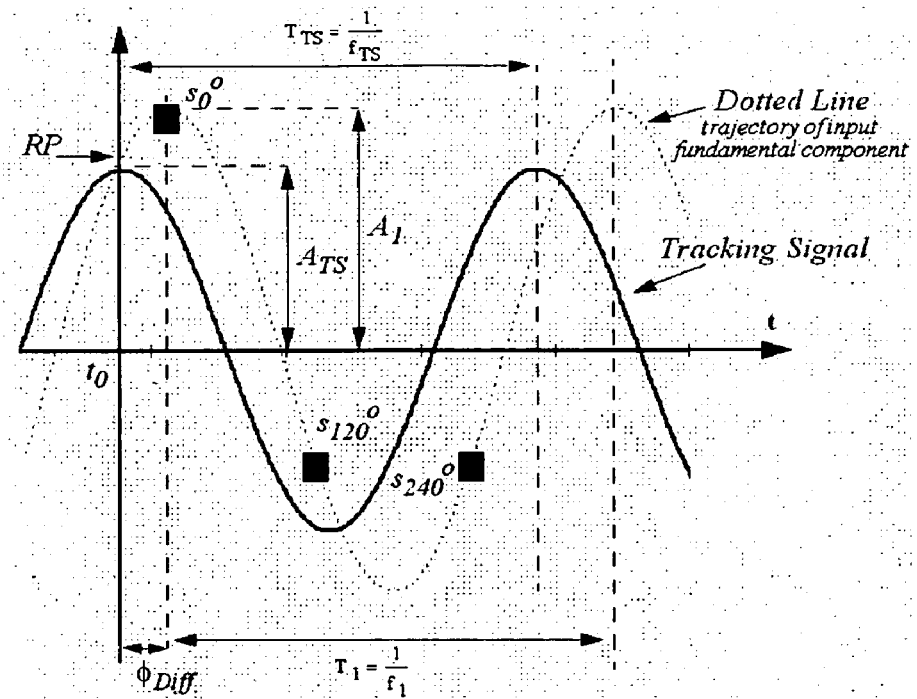
FIG. 7 illustrates three-sample cosine-wave (squares) and the tracking signal.

The accumulator acquires three 120° equidistant samples from the input fundamental component referred to as $s_0$, $s_{120}$, and $s_{240}$. The three 120°-samples are used to characterize one period of a sinusoidal waveform and are henceforth called a three-sample cosine-wave. FIG. 7 shows the samples of the three-sample cosine-wave as squares that lie on the trajectory of the sinusoidal waveform (dotted line). FIG. 7 also depicts the tracking signal where $f_{TS} \neq f_1$ and $A_{TS} \neq A_1$ and considering RP at the positive peak value. A positive peak reference-point coincides with $s_0$ and consequently under steady state conditions, all three 120°-samples are nonzero. Nonzero values of $s_0$, $s_{120}$, and $s_{240}$ are desired in order to avoid computations that lead to a division by zero.

The samples ($s_0$, $s_{120}$, and $s_{240}$) of the three-sample cosine-wave are obtained by phase shifting the argument in equation (2) by 120° with respect to the same time instance $t_0$ where $\alpha = 2\pi \cdot f_1 \cdot t_0$ and $t_0$ coincides with the positive peak reference-point such that $$s_0 = A_1 \cdot \cos(\alpha - \phi_{Diff}),\qquad(5)$$

$$s_{120} = A_1 \cdot \cos\left(\alpha - \phi_{Diff} - \frac{2\pi}{3}\frac{f_1}{f_{TS}}\right),\qquad(6)$$

$$s_{240} = A_1 \cdot \cos\left(\alpha - \phi_{Diff} - 2 \cdot \frac{2\pi}{3}\frac{f_1}{f_{TS}}\right).\qquad(7)$$

The accumulator is comprised of: a collect samples module that stores the three 120°-samples; a counter module that counts the number of samples stored; and a cycle counter and control signals module that generates an enable signal when three 120°-samples from one period are collected and then initiates the computation process executed by the predictor.

Processor Module

The processor employs $s_0$, $s_{120}$, and $s_{240}$ from the three-sample cosine-wave and computes the synchronization information, i.e. the frequency ($f_1$), amplitude ($A_1$), and the phase-difference ($\Phi_{Diff}$). The processor requires a set of mathematical expressions for computing the synchronization information.

A lower cost of implementation and a wide operating frequency range can be achieved if the following objectives are met: the speed of computing the synchronization information is maximized; and the real estate required for implementation is minimized.

In some embodiments, these objectives are sought to be achieved by one or more of the following: computing synchronization information so that calculations are not performed sequentially. Hence, the algorithm can be implemented by means of parallel processing that leads to a faster execution speed when $f_1$, $A_1$, and $\Phi_{Diff}$ change simultaneously. The parallel processing should not lead to a significant increase in hardware real estate; and utilizing expressions requiring simple mathematical operations such as additions and/or multiplication so that the real estate consumed is minimized.

Two schemes for classifying the computation of $f_1$, $A_1$, and $\Phi_{Diff}$ are identified. The mathematical properties and derivations of two classes of computational methods are provided below.

Transformed Method

The three-sample cosine-wave defined by equations (5) to (7) is processed based on the following mathematical approach in order to compute $f_1$, $\Phi_{Diff}$, and $A_1$. The dqz-frame transforms the three-sample cosine-wave into a dq rotating coordinate system by employing the following transformation matrix $$\begin{pmatrix} s_d \\ s_q \\ s_z \end{pmatrix} = \frac{2}{3} \cdot \begin{pmatrix} \cos(\theta) & \cos(\theta-\gamma) & \cos(\theta-2\cdot\gamma) \\ -\sin(\theta) & -\sin(\theta-\gamma) & -\sin(\theta-2\cdot\gamma) \\ \frac{1}{2} & \frac{1}{2} & \frac{1}{2} \end{pmatrix} \cdot \begin{pmatrix} s_a \\ s_b \\ s_c \end{pmatrix}, \quad (8)$$

where $\gamma=120°$, $\theta=2\pi ft$, given a system frequency of f, $s_d$, $s_q$, and $s_z$ are the direct, quadrature, and zero components respectively, and $$s_a = A \cdot \cos(2\pi \cdot f \cdot t), \quad (9)$$

$$s_b = A_1 \cdot \cos\left(2\pi \cdot f \cdot t - \frac{2\pi}{3}\right), \quad (10)$$

$$s_c = A_1 \cdot \cos\left(2\pi \cdot f \cdot t - 2 \cdot \frac{2\pi}{3}\right), \quad (11)$$

with A, and t denoting the amplitude and the instantaneous time respectively.

In the case of the PPLL, the three-sample cosine-wave is similar to a single-phase waveform and the dqz-transformation is not applicable. However, the PPLL treats the single phase three-sample cosine-wave as a three-phase signal by applying two consecutive 120° phase shifts to acquire each 120°-sample. Hence, setting $\gamma=120°$ and replacing $s_0$, $s_{120}$, and $s_{240}$ with $s_a$, $s_b$, and $s_c$ of equation (8) results in the following expression $$\begin{pmatrix} s_d \\ s_q \\ s_z \end{pmatrix} = \frac{2}{3} \cdot \begin{pmatrix} 1 & -\frac{1}{2} & -\frac{1}{2} \\ 0 & \frac{\sqrt{3}}{2} & -\frac{\sqrt{3}}{2} \\ \frac{1}{2} & \frac{1}{2} & \frac{1}{2} \end{pmatrix} \cdot \begin{pmatrix} s_0 \\ s_{120} \\ s_{240} \end{pmatrix}. \quad (12)$$

The amplitude ($A_1$) and phase-difference ($\Phi_{Diff}$) of the three-sample cosine-wave are given by:

$$A_1 = \sqrt{s_d^2 + s_q^2}, \quad (13)$$

and $$\Phi_{Diff} = a\tan\left(\frac{s_q}{s_d}\right). \quad (14)$$

respectively, where $s_d$ and $s_q$ are given by (12).

Equation (13) indicates that the computation of the input fundamental component amplitude is independent of the frequency or the phase-difference values. Similarly, equation (14) is independent of phase-difference and frequency.

The frequency of the three-sample cosine-wave is determined using the expression for $s_z$ from equation (12) and is restated below $$s_z = \frac{s_0 + s_{120} + s_{240}}{3}, \quad (15)$$

A zero value of $s_z$ refers to the steady state operation of the PPLL where the frequency of the tracking signal is identical to the frequency of the input fundamental component ($f_{TS}=f_1$), otherwise, a nonzero $s_z$ indicates $f_{TS} \neq f_1$.

Consequently, $f_1$ must be determined and this forces $f_{TS}$ to become equal to $f_1$. $f_1$ is determined by substituting equations (5) to (7) into equation (15). This results in $$s_z = \frac{A_1}{3} \cdot \left(\cos\left(2\cdot\pi\cdot\frac{f_1}{f_{TS}}\right) + \cos\left(2\cdot\pi\cdot\frac{f_1}{3\cdot f_{TS}}\right) + \cos\left(2\cdot\pi\cdot\frac{2\cdot f_1}{3\cdot f_{TS}}\right)\right). \quad (16)$$

G is defined as a function of $f_1$ such that $$G(f_1) = \frac{A_1}{3}\left(\cos\left(2\pi\frac{f_1}{f_{TS}}\right) + \cos\left(2\pi\frac{f_1}{3f_{TS}}\right) + \cos\left(2\pi\frac{2f_1}{3f_{TS}}\right)\right) - s_z. \quad (17)$$

Equation (17) can be solved for $f_1$ by an iterative method such as the Newton-Raphson method by first taking the derivative of equation (17) as given below $$\frac{d}{df_1}G(f_1) = \frac{2\pi A_1}{3f_{TS}} \cdot \begin{pmatrix} \sin\left(2\pi \cdot \frac{f_1}{f_{TS}}\right) + \frac{1}{3}\sin\left(2\pi \cdot \frac{f_1}{3 \cdot f_{TS}}\right) + \\ \frac{2}{3} \cdot \sin\left(2\pi \cdot \frac{2f_1}{3 \cdot f_{TS}}\right) \end{pmatrix}, \quad (18)$$

and then substituting equations (17) and (18) into the following relation $$f_1 = f_{TS} - \frac{G(f_1)}{\frac{d}{df}G(f_1)}. \quad (19)$$

The relation in (19) is computed and $f_{TS}$ is replaced by the resulting $f_1$. The iterations are repeated until an acceptable accuracy, specified by the design requirements, is achieved.

Sequential Method

The three-sample cosine-wave given by equations (5) to (7) is used to compute the synchronization information in the following sequence: $f_1$ followed by $\Phi_{Diff}$ followed by $A_1$.

The three-sample cosine-wave is defined as a cosine function in equations (5) to (7) where the reference-point (RP) is selected at the positive peak. A sine function instead of a cosine function can be used in expressing (5) to (7). This leads to a three-sample sine-wave with the three 120°-samples expressed as $$s_0 = A_1 \cdot \sin(\alpha - \phi_{Diff}), \quad (20)$$

$$s_{120} = A_1 \cdot \sin\left(\alpha - \phi_{Diff} - \frac{2\pi}{3}\frac{f_1}{f_{TS}}\right), \quad (21)$$

$$s_{240} = A_1 \cdot \sin\left(\alpha - \phi_{Diff} - 2 \cdot \frac{2\pi}{3}\frac{f_1}{f_{TS}}\right). \quad (22)$$

where $\alpha = 2\pi \cdot f_1 \cdot t_0$ and $t_0$ is a time instant chosen at the positive zero crossing reference-point (RP). The derivation of $f_1$ based on a cosine function followed by a sine function will now be described.

The input fundamental component frequency ($f_1$) is computed by considering that $f_{TS}$ is already known from a previous prediction period or initially, during start up, is selected around the expected system frequency. The summation of the three equations (5) to (7) is given as follows $$s_0 + s_{120} + s_{240} = A_1 \cdot \cos(\alpha - \phi_{Diff}) + \quad (23)$$
$$A_1 \cdot \cos\left(\alpha - \phi_{Diff} - \frac{2\cdot\pi}{3} \cdot \frac{f_1}{f_{TS}}\right) +$$
$$A_1 \cdot \cos\left(\alpha - \phi_{Diff} - 2 \cdot \frac{2\cdot\pi}{3} \cdot \frac{f_1}{f_{TS}}\right),$$

The equation in (23) can be rearranged into the following form $$s_0 + s_{120} + s_{240} = A_1 \cdot \begin{pmatrix} \cos(\alpha - \phi_{Diff}) + \\ 2 \cdot \cos(\alpha - \phi_{Diff}) \cdot \cos\left(\frac{2 \cdot \pi}{3} \cdot \frac{f_1}{f_{TS}}\right) \end{pmatrix}, \quad (24)$$

by employing the following trigonometric identity, $$\cos x \cdot \cos y = \frac{1}{2} \cdot (\cos(x+y) + \cos(x-y)), \quad (25)$$

where x and y in equation (25) are $$x = \alpha - \phi_{Diff}, \quad (26)$$

$$y = \frac{2 \cdot \pi}{3} \cdot \frac{f_1}{f_{TS}}. \quad (27)$$

Factoring out $\cos(\alpha - \Phi_{Diff})$ in equation (24) and substituting from equation (5) and rearranging, gives $$s_{120} + s_{240} = 2 \cdot s_0 \cdot \cos\left(\frac{1}{3} \cdot 2 \cdot \pi \cdot \frac{f_1}{f_{TS}}\right), \quad (28)$$

Rearranging (28) results in the following equation for $f_1$ $$f_1 = f_{TS} \cdot \frac{3}{2 \cdot \pi} \cdot a\cos\left(\frac{s_{120} + s_{240}}{2 \cdot s_0}\right), \quad (29)$$

where equation (29) relates the frequency of the input fundamental component ($f_1$) to the tracking signal frequency ($f_{TS}$).

Equation (29) also indicates that the computation of the input fundamental component frequency ($f_1$) is independent of the amplitude ($A_1$) and phase-difference ($\Phi_{Diff}$).

The computation of the input fundamental component amplitude ($A_1$) and phase-difference ($\Phi_{Diff}$) require the knowledge of $f_1$ from expression (29). Subsequent to the computation of $f_1$, the phase-difference ($\Phi_{Diff}$) followed by the amplitude ($A_1$) are computed as follows.

Relation (5) is divided by (6) and then results in the following expression $$\frac{s_0}{s_{120}} = \frac{\cos(\alpha - \phi_{Diff})}{\cos\left(\alpha - \phi_{Diff} - \frac{2\pi}{3}\frac{f_1}{f_{TS}}\right)}. \quad (30)$$

The expression in (30) is rearranged into (32) by employing the following trigonometric identity and substituting from (5).

$$\cos(x+y) = \sin(x) \cdot \cos(y) + \cos(x) \cdot \sin(y), \quad (31)$$

$$K = \frac{1}{K_c \cdot \frac{\sin(x)}{\cos(x)} + K_s}, \quad (32)$$

where $$x = \alpha - \phi_{Diff}, \quad (33)$$

$$y = \frac{2 \cdot \pi}{3} \cdot \frac{f_1}{f_{TS}}, \quad (34)$$

$$K = \frac{s_0}{s_{120}}, \quad (35)$$

$$K_c = \cos(y), \quad (36)$$

$$K_s = \sin(y). \quad (37)$$

Rearranging the expression in (32) as a function of the phase-difference ($\Phi_{Diff}$) gives the following expression $$\phi_{Diff} = atan\left(\frac{1 - \frac{s_0}{s_{120}} \cdot \sin\left(\frac{2\pi}{3} \frac{f_1}{f_{TS}}\right)}{\frac{s_0}{s_{120}} \cdot \cos\left(\frac{2\pi}{3} \frac{f_1}{f_{TS}}\right)}\right). \quad (38)$$

Equation (38) shows that the computation of the phase-difference depends on $f_1$ where $f_1$ is given by (29).

The amplitude of the input fundamental component is computed by substituting from equation (38) into equation (5) and solving for $A_1$ such that $$A_1 = \frac{s_0}{\cos(\phi_{Diff})}. \quad (39)$$

Equation (39) indicates that the computation of the amplitude ($A_1$) depends on the knowledge of the phase-difference ($\Phi_{Diff}$) where $\Phi_{Diff}$ also depends on the computation of $f_1$.

The developed computational method, i.e. the sequential method, depends on the computation of $f_1$ prior to the computation of the phase-difference ($\Phi_{Diff}$) and amplitude ($A_1$).

A comparison of the two methods just presented reveals the following.

Transformed Method. The amplitude obtained from (13) and the phase-difference from (14) are determined directly from the three 120°-samples ($s_0$, $s_{120}$, and $s_{240}$) and are independent of each other or the frequency value ($f_1$). The calculation of frequency ($f_1$) using (39) requires knowledge of the amplitude ($A_1$) as well as an iteration process.

Sequential Method. The calculation of frequency ($f_1$) using (29) from the 120°-samples is determined independently of the amplitude ($A_1$) or phase-difference ($\Phi_{Diff}$). The calculation of the phase-difference using (38) depends on knowledge of the frequency ($f_1$) determined by equation (29). Moreover, as compared to the computation of the amplitude using (13) from the transformed method, the calculation of phase-difference using (38) requires three additional trigonometric operations that adds to the computational complexity. The amplitude obtained from (39) depends on the knowledge of the phase-difference and hence the frequency. Moreover, (39) requires one trigonometric operation as opposed to the amplitude determined using (14) from the transformed method.

Figure 8:
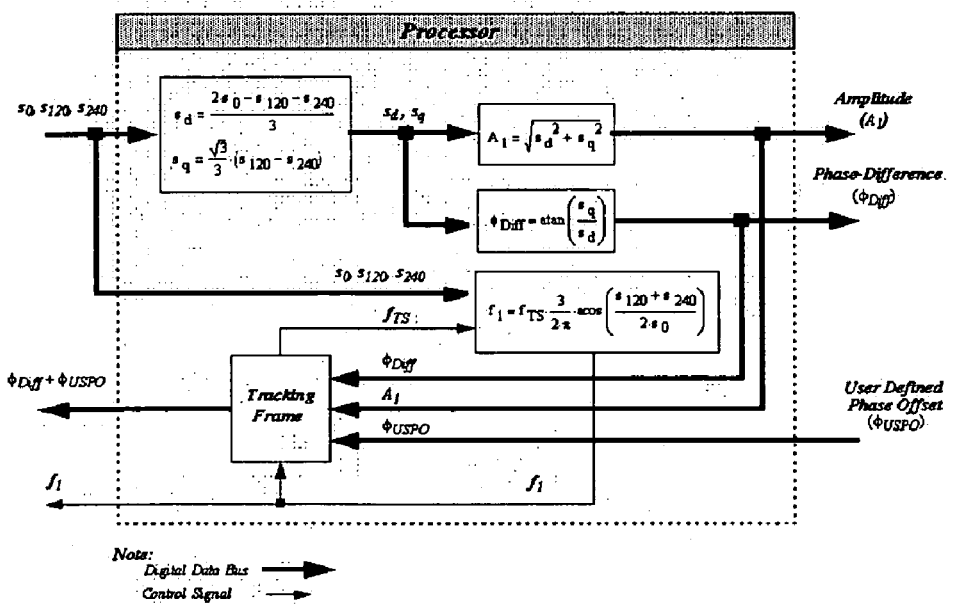
FIG. 8 illustrates the operation of each module in the predictor of the PPLL.

The expressions executed by the preferred embodiment of the predictor are illustrated in FIG. 8.

Phase Locking of PPLL

The PPLL phase locking mechanism that forces the tracking signal to become equal to the input fundamental component and hence extracts synchronization information will now be described.

The computation of the synchronization information using expressions (13), (14), and (29) from the three-sample cosine-wave requires knowledge of the three 120°-samples extracted from the input signal. The three-sample cosine-wave is generated by first digitizing the input signal with an analog to digital converter and then extracting the input fundamental component with a digital band-pass filter. The center frequency of the digital band-pass filter coincides with the input signal fundamental component. The input signal frequency may vary in the range given below $$f_{1Min} \leq f_1 \leq f_{1Max}, \quad (40)$$

where $f_{1Min}$ and $f_{1Max}$ are the minimum and maximum values of the input fundamental frequency respectively.

A frequency adaptive band-pass filter is required: (a) to filter frequencies above and below the center frequency; (b) to maintain a zero degree phase shift between the input and output fundamental component; and (c) to maintain a constant amplitude as the frequency is varied. A digital filter operates based on a sample window and for an adaptive filter, synchronous sampling is employed to maintain the number of samples within the sample window constant. The concept of variable sampling is explored in [4] and [12] where the sampling frequency ($f_{sam}$) of the ADC is varied to maintain a constant number of samples ($N_s$) per input fundamental component such that $$N_s = \frac{f_{sam}}{f_1}, \quad (41)$$

where the sampling frequency varies for a range of $$f_{samMin} \leq f_{sam} \leq f_{samMax}, \quad (42)$$

with $f_{samMin}$ and $f_{samMax}$ being the minimum and maximum sampling frequencies respectively.

Figure 9:
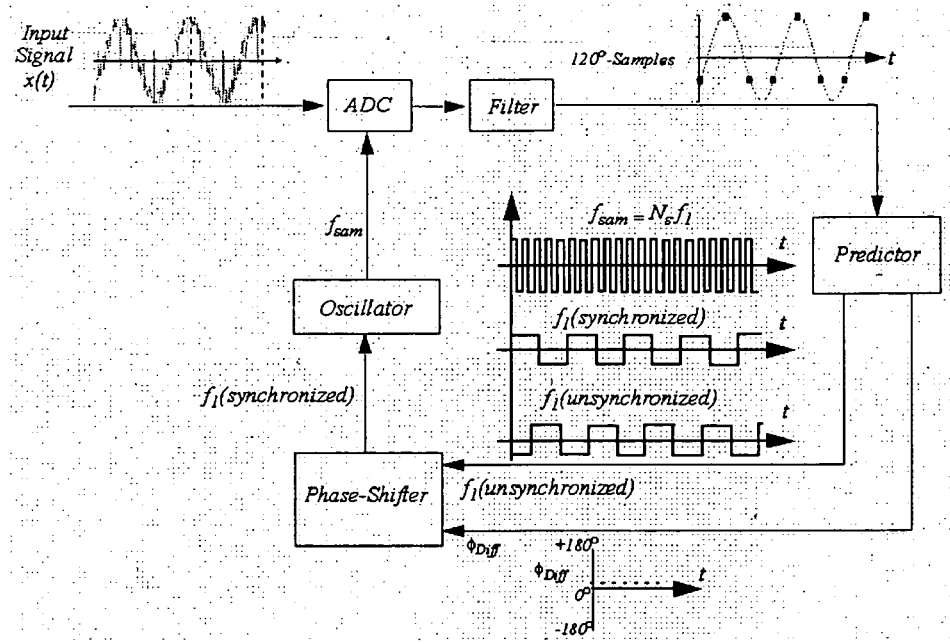
FIG. 9 is a simplified block diagram of a PPLL illustrating the phase locking principles.

A simplified block diagram showing the operation is shown in FIG. 9.

The frequency calculated in (29) is independent of the phase-difference ($\Phi_{Diff}$) and hence is not necessarily aligned with the reference-point. The phase-shifter sub-module adjusts the edge of the unsynchronized $f_1$ so that its rising edge becomes aligned with the reference-point. This results in synchronization with respect to the input fundamental component.

The sampling frequency ($f_{sam}$) is an integer multiple of $f_1$ (synchronized) and this allows the analog to digital converter to operate with synchronous sampling. This synchronized sampling is enforced by the phase locking mechanism of the PPLL.

The sampling frequency controls the ADC and hence performs the task of synchronous sampling. The PPLL design employed is a modified version of the synchronous sampling implementation described in [4] and [12]. The ADC in the proposed method is sampled at a constant rate, much higher than $f_{sam}$, and the synchronous sampling is implemented by employing an adaptive down sampler. The details of the method are explained below.

The PPLL phase locking mechanism is similar to a phase locked loop (PLL) in the sense that the PPLL locks to the phase of the input signal. This characteristic of the PPLL complies with the definition of the PLL [13] and hence leads to the selection of the name predictive "phase locked loop" (PPLL). On the other hand, the PPLL functionality differs from the conventional PLL architecture in that the PPLL employs analytical expressions for computing the frequency, amplitude, and phase-difference. Moreover, the name "predictive" stems from the fact that prior to expiry of the current period of the input fundamental component, the frequency ($f_1$), amplitude ($A_1$), and phase-difference ($\Phi_{Diff}$) are predicted.

Data Acquisition Module

Figure 10:
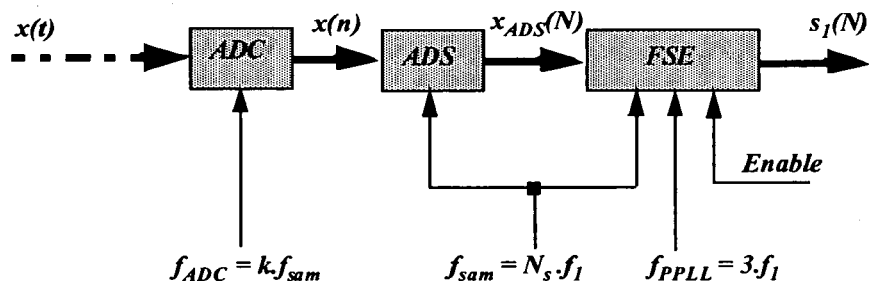
FIG. 10 illustrates the data acquisition (DA) module.

Referring to FIG. 10, a data acquisition (DA) module will now be described. The DA module consists of an analog to digital converter (ADC), an adaptive down sampler (ADS), and a fundamental sample extractor (FSE). The objective of the DA module is to provide the three-sample cosine-wave from the input signal, x(t). The three-sample cosine-wave is obtained by means of the following sub-modules:

ADC—Over-samples the input signal using an analog to digital converter and provides the samples to the ADS sub-module;

ADS—Down-samples the over-sampled input signal to $N_s$ samples and provides them to the FSE sub-module; and, FSE—Extracts the input fundamental component from the $N_s$ samples and down-samples the input fundamental component into three 120°-samples that form the three-sample cosine-wave.

Fundamental Sample Extractor (FSE)

The FSE extracts the three-sample cosine-wave from $N_s$ samples provided by the adaptive down sampler. In the process of extracting the three-sample cosine-wave, the FSE must avoid the filter oscillation phenomenon. The filter oscillation occurs due to a discontinuity in the sample window of the filter as the PPLL enforces retardation/advancement of the tracking signal. The filter should be designed to minimize the duration of the oscillation. The primary filter design criteria are comprised as follows:

Incorporating a decimator that can down-sample $N_s$ samples into three 120°-samples. This type of implementation improves the execution speed and reduces the amount of real estate utilized and thus the power dissipated;

Minimizing oscillation duration so as to maximize the execution speed; minimizing filter bandwidth so that only the fundamental component is extracted; and, Maximizing attenuation for frequencies other than the fundamental component.

A number of filter implementation approaches have been explored based on the filter design criteria and as a result a finite impulse response band-pass filter (FIR-BPF) is employed as opposed to an infinite impulse response (IIR) filter for the following reasons:

An IIR filter is recursive with a feed back path from the output to the input of the filter. The computation of the current output of the IIR filter requires the previous filter outputs. Therefore, all the output values of the filter are to be computed for an IIR filter. On the other hand, a FIR filter is non-recursive with no feed back path and hence the computation of the current filter output is independent of the previous filter outputs. This characteristic of the FIR filter allows the implementation of a decimator module. Therefore, for the case of the PPLL, a FIR filter computation is less complex as opposed to an IIR filter.

A FIR filter exhibits an oscillation for $N_{Filt}-1$ samples, for the case of $N_s=N_{Filt}$, where $N_{Filt}$ is the filter order. In contrast, an IIR filter oscillates indefinitely since an infinite sample window must be processed.

Figure 11:
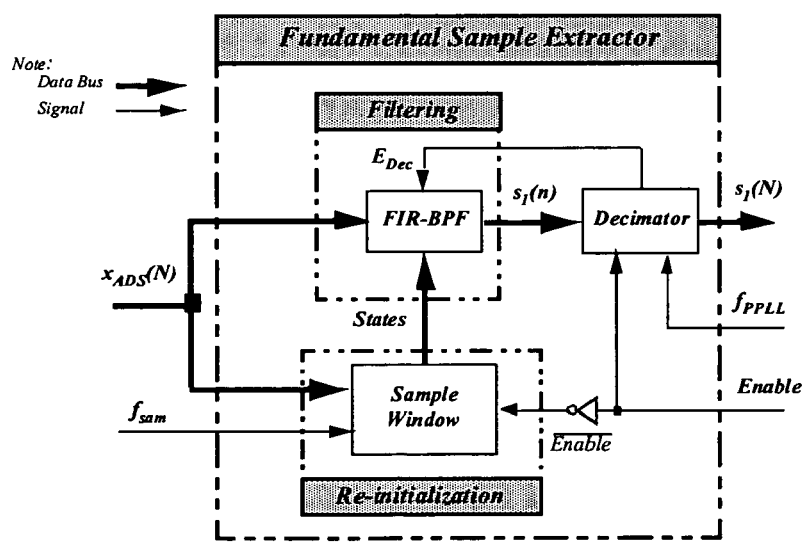
FIG. 11 is a block diagram of a fundamental sample extractor (FSE)

FIG. 11 shows the FSE module diagram which consists of re-initialization, filtering, and decimator sub-modules.

Figure 12:
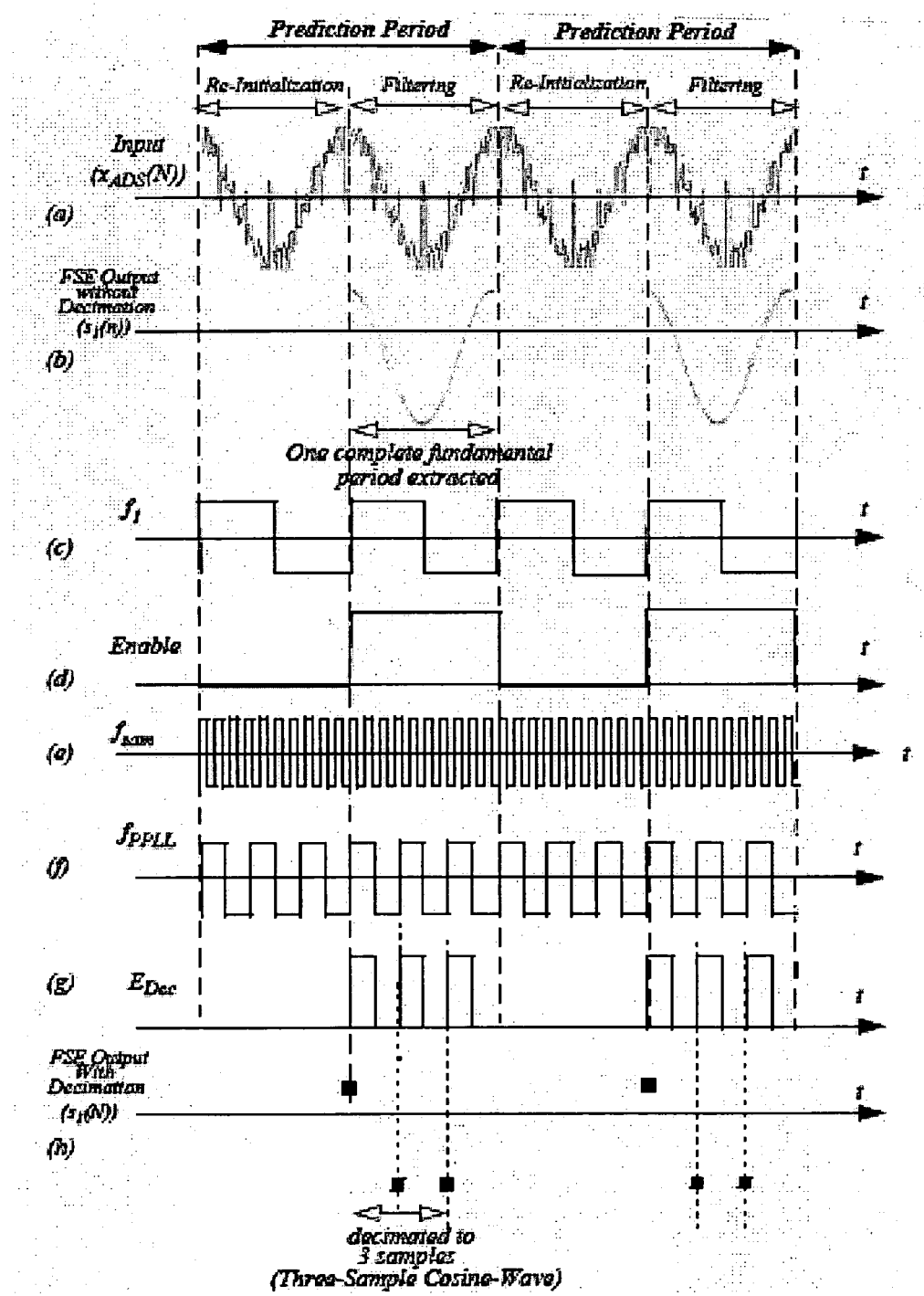
FIG. 12 illustrates FSE waveforms.

The functions of the FSE sub-modules are described next in conjunction with the key waveforms shown in FIG. 12.

Re-initialization. The re-initialization sub-module stores the filter state variables from the input signal in order to form a sample window. Re-initialization allows a new sample window to be substituted with the old sample window that does not contain any sample discontinuity. The sample discontinuity may occur due to a retardation/advancement applied by the PPLL to force $\Phi_{Diff}$ to zero. The input signal ($x_{ADS}(N)$) to the re-initialization sub-module is shown in FIG. 12(a).

The rate at which the re-initialization is executed is controlled by the sampling frequency ($f_{sam}$) where $f_{sam}$ is shown in FIG. 12(e). The re-initialization is activated by a complemented Enable signal that is generated by the predictor module at the rate of a prediction period. The Enable signal is shown in FIG. 12(d).

During re-initialization, the filtering is disabled by a complemented form of the Enable signal and the FSE generates no output.

Filtering. The filtering sub-module receives the state variables from the sample window in the re-initialization sub-module and employs a finite impulse response band-pass filter (FIR-BPF) to filter the three 120°-samples. The three 120°-samples ($s_1(N)$) are illustrated in FIG. 12(h).

An enable signal ($E_{Dec}$) controls the filtering. $E_{Dec}$ is determined by the decimator sub-module and shown in FIG. 12(g).

Decimator. The decimator sub-module down-samples $N_s$ samples so that only three 120°-samples are processed by the filtering sub-module. A reduction in the number of samples for filtering reduces the utilization of the computational resources. The decimator generates an enable signal ($E_{Dec}$) by performing a logical AND on the Enable signal and $f_{PPLL}$. The Enable, $f_{PPLL}$, and $E_{Dec}$ are shown in FIGS. 12(d), (f), and (g) respectively. FIG. 12(b) also depicts the output of the FSE with no decimation implemented.

Discussion. It is desirable to minimize the propagation delay of the filter so that the execution speed of the PPLL is maximized. Therefore, the re-initialization duration must be minimized by minimizing the size of the sample window. The minimum sample window is equal to one period of the input fundamental component. Therefore, denoting the filter order and the number of samples per period of the input signal as $N_{Filt}$ and $N_s$ respectively results in $$N_{Filt}=N_s. \tag{43}$$

$N_s$ is selected as a multiple of 3 so as to accommodate the three 120°-samples and is determined by employing the following procedure.

A distorted signal containing harmonics, noise, along with the fundamental component is constructed and used as a test signal for developing the FIR-BPF. The coefficients of the FIR-BPF and $N_{Filt}$ are determined by trial and error so that the filter demonstrates the desired attenuation and bandwidth. $N_{Filt}$ must also be a multiple of 3 so as to satisfy the conditions that $N_1$ should be integral multiple of 3 to accommodate the three 120°-samples.

A comparison among various window functions including Rectangular, Blackman, Hamming, and Hanning for FIR filters indicate that the Hamming window can provide a good compromise between the narrowness of the bandwidth and the side-lobe attenuation level as compared to other window functions. Therefore, the Hamming window is chosen for the implementation of the FIR-BPF.

Analog to Digital Converter (ADC)

The analog to digital converter (ADC) converts the continuous time input signal (x(t)) into a digital form using a sampling frequency $f_{ADC}$. The choice of sampling frequency is important since the sampling of an input signal with an infinite bandwidth results in aliasing. In order to prevent aliasing, an analog low-pass filter (ALPF) is implemented at the front end of the ADC module. FIG. 13(a) shows a bode plot for the ALPF with the following criteria:

Cutoff frequency is equal to the maximum of the frequency of the input fundamental component ($f_{1Max}$), Sampling frequency is equal to $f_{ADC}$, and Attenuation (Att) is considered as the desired level of attenuation based on the signal fidelity.

The following two solutions to an anti-aliasing filter are possible:

One—A higher order ALPF is used to achieve a sharp transition edge, and

Two—A higher sampling frequency is used to relax the attenuation requirements on the ALPF (low order filter).

Figure 13:
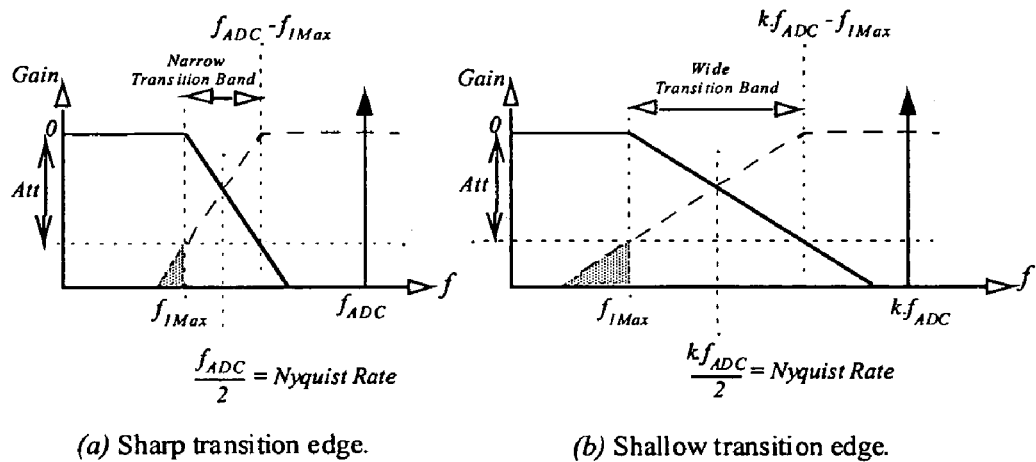
FIG. 13 illustrates bode plots for an analog low-pass filter (ALPF)

The design of a high order ALPF is not a trivial task, for instance, a Butterworth filter that attenuates 60 dB requires 10 poles that is difficult to achieve. On the other hand, it is possible to select the sampling frequency of the ADC as the maximum functional sampling frequency offered by the ADC device. As a result, the Nyquist frequency is pushed to a higher frequency range and hence the ALPF requires a lower filter order with a shallow transition edge. FIG. 13(b) shows a bode plot for the case where the sampling frequency is much higher than the case in FIG. 13(a) by a factor of k where $k \gg N_s$. The shaded area in FIG. 13 shows the aliasing in the pass-band that leads to a reduction in the dynamic range.

The compromise between sampling frequency and resolution of the ADC will now be briefly discussed. An ADC accepts an analog input signal, a voltage or a current, and converts it to a digital value. The most common use of the digital value is to be manipulated by a microprocessor or a field programmable gate array (FPGA). ADCs are available in various speeds, with different interfaces, and provide different levels of accuracy. The most common implementations of ADCs are described below.

Flash (direct conversion) ADCs. A flash ADC has a comparator that fires for each decoded voltage range. The comparator bank feeds a logic circuit that generates a code for each voltage range. Flash is very fast, however, it has usually 8-bits of resolution (256 comparators). Flash ADCs have a large die size, a high input capacitance, and produce glitches on the output signal. Flash ADCs are the fastest type of ADC available and are often used for fast signals such as video. Flash ADCs consume large amounts of integrated chip (IC) real estate and are power intensive. An 8-bit flash ADC consumes approximately half an ampere.

Successive-approximation ADCs. A successive-approximation ADC employs a comparator to reject ranges of voltages and eventually settles on a final voltage range. The successive approximation constantly compares the input voltage to a reference voltage until the best approximation is achieved and stores a binary value of the approximation in a successive approximation register (SAR). The SAR uses a reference voltage for comparisons. For instance, consider the use of a 3-bit ADC with an input voltage of 150 V and a reference of 100 V. In the first clock cycle, the reference is less than input voltage and is then negative. In the second clock cycle, the reference is increased by 30 V (the increment is predetermined) to 130 V that again results in a negative value. In the third clock cycle, the reference becomes 160 V that results in a positive comparison. As a result, a binary value of 110 is generated where the "1" refers to when the comparison results in a negative value and the "0" is for the positives (this example considered a 3-bit ADC). It is possible to construct an accurate ADC by increasing the number of bits. SAR ADCs offer good resolutions and wide ranges but have more complex structures.

Sigma-Delta (Delta-Sigma) ADCs. A Sigma-Delta (Delta-Sigma) ADC employs a 1-bit digital-to-analog converter (DAC), filter, and performs over-sampling to achieve very accurate conversions. The conversion accuracy is controlled by the input reference and the input clock rate. The primary advantage of a sigma-delta converter is high resolution and the disadvantage is the relatively low upper limit on the sampling rate. Because the converter works by over-sampling the input, the conversion takes many clock cycles. In fact, for a given clock rate, the sigma-delta converter is slower than other converter types. Another disadvantage of the sigma-delta converter is the complexity of the digital filter that converts the duty cycle information to a digital output word.

The design and implementation of the WSS require a fast sampling frequency as well as a high accuracy ADC for sampling of the analog input signal. The preferred ADC structure and resolution for the design of the system as applied to power systems applications will now be described.

Figure 43:
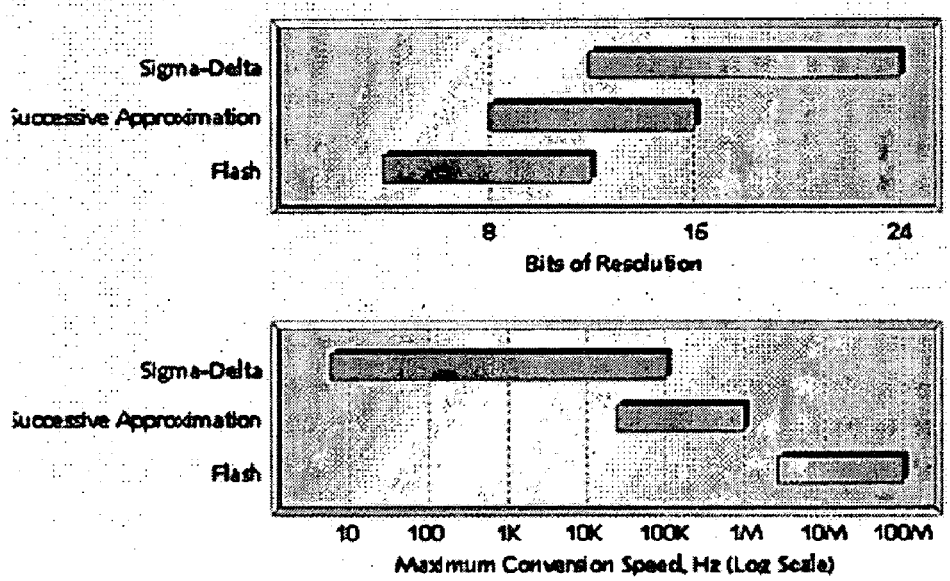
FIG. 43 is comparison of different types of Analog-to-Digital Converters (ADCs).

FIG. 43 shows the range of resolutions and maximum conversion speed available for sigma-delta, successive approximation, and flash conversion ADCs. The speed of available sigma-delta ADCs reaches into the range of the successive approximation ADCs, but is not as fast as even the slowest flash ADCs. On the other hand, the resolution offered by the flash ADCs is not comparable with sigma-delta. Important factors in selecting among the flash, sigma-delta, and SAR analog-to-digital converters are shown in the following table.

| Design | Speed | Resolution | Power Dissipation | Group Delay | Cost |
|---|---|---|---|---|---|
| SAR | Medium | 10-16 Bits | Medium | N/A | Medium |
| Flash | Fast | 4-8 Bits | High | N/A | Low |
| Delta-Sigma | Slow | 20-24 Bits | Low | Yes | High |

Flash ADCs offer a very fast sampling frequency that is not typically required for the case of power systems applications. These applications are concerned with signals with low frequencies in the order of a few kHz and hence do not require very fast sampling rates. In addition, the flash ADCs offer very few bits that reduce the accuracy of the sampled data.

Sigma-delta ADCs offer very high resolution capabilities and can provide high accuracy in the sampling of the input signal. However, the sigma-delta ADC suffers from relatively low sampling rates. Another problem with the sigma-delta ADC is the group delay that introduces a phase shift on the input signal. The phase shift introduced by the sigma-delta ADC delays the extraction of the synchronization information by the WSS. Hence, the real-time access to power systems information is not possible.

SAR-based ADCs offer a reasonably high sampling frequency that can well accommodate the need for the power system applications. In addition, the SAR is capable of providing resolutions comparable to those from sigma-delta ADCs. The cost of the SAR-based ADCs is also relatively low. In view of the foregoing, a SAR-based ADC is preferred for the implementation of the WSS.

A set of ADCs with different structures and resolutions including delta-sigma and SAR with resolutions of 12, 14, 16, 18, and 24 bits were implemented and tested for the WSS. The ADCs tested were model ADS7810 from Texas Instruments Incorporated (see 12-Bit, A/D Converter Data Sheet, BB available at http://www.ti.com/), model AD6644 from Analog Devices, Inc. (see 14 Bit, A/D Converter Data Sheet available at http://www.analog.com/), model ADS8361 from Texas Instruments Incorporated (see 16-Bit, Converter Data Sheet, BB available at http://www.ti.com/), model ADS8381 from Texas Instruments Incorporated (see 18-Bit, A/D Converter Data Sheet, BB available at http://www.ti.com/), and model ADS1271 from Texas Instruments Incorporated (see 24-Bit, A/D Converter Data Sheet, BB, available at http://www.ti.com). The results were compared and from the results it was experimentally determined that a 16-bit SAR-based ADC is preferred for implementing the WSS for power systems. The experimental results indicate that this ADC offers the best compromise between the sampling frequency and the resolution for the WSS as required by power systems applications.

Adaptive Down Sampler

Referring to FIG. 13, the design of an adaptive down sampler (ADS) will be described.

As mentioned above, the selection of the ADC sampling frequency ($f_{ADC}$) is maximized by selecting the functional sampling rate offered by the ADC device such that:

$f_{ADC}$=Constant, and $f_{ADC} \gg f_{sam}$.

This selection leads to the following consequences:

One. The choice of $f_{ADC} \gg f_{sam}$ results in more samples than the required $N_s$ and hence requires a mechanism for processing only $N_s$ samples and removing the excess samples.

Two. The choice of $f_{ADC}$=Constant requires another mechanism for implementing the variable sampling frequency ($f_{sam}$) based on equation and hence maintaining the locking mechanism of the PPLL.

Therefore, the design of the ADS is considered with the following objectives in mind:

Reduce the excess samples resulting from over-sampling of the input signal into $N_s$ samples as required by the FSE sub-module, and Provide a mechanism for implementing the PPLL locking mechanism.

The ADS is comprised of a decimator with a varying rate of down-sampling. The rate of down-sampling is determined by the relation in (41). Therefore, as $f_1$ varies the PPLL changes $f_{sam}$ and hence the ADS outputs a constant number of samples, $N_s$.

The design of the ADS facilitates the software implementation of the WSS. Typically, an algorithm implementation consists of a software implementation that configures a hardware device such as a microprocessor. In addition to a microprocessor, a digital implementation of a synchronization system requires an ADC device. The microprocessor contains the software segment that represents the algorithm excluding the part controlling the ADC. Furthermore, the ADC must be configured so as to change the sampling rate dynamically. Simulation of such a system requires the addition of an ADC model which adds to the complexity of simulation. The introduction of the adaptive down sampler eliminates the need for such a model and simplifies the design process.

Oscillator/Phase-Shifter

The oscillator/phase-shifter consists of two sub-modules: an oscillator and a phase-shifter. The oscillator sub-module determines the PPLL frequency ($f_{PPLL}$) and the sampling frequency ($f_{sam}$) given as:

$$f_{PPLL} = 3 \cdot f_1, \tag{44}$$

and $$f_{sam} = N_s \cdot f_1, \tag{45}$$

respectively where: 3 is due to the three 120°-samples per cycle of the input signal required by the PPLL; $N_s$ is the number of samples per cycle of the input signal. The three 120°-samples are extracted from the $N_s$ samples of the input signal; and, $f_1$ is the input fundamental component frequency.

Retardation/Advancement

Figure 14:
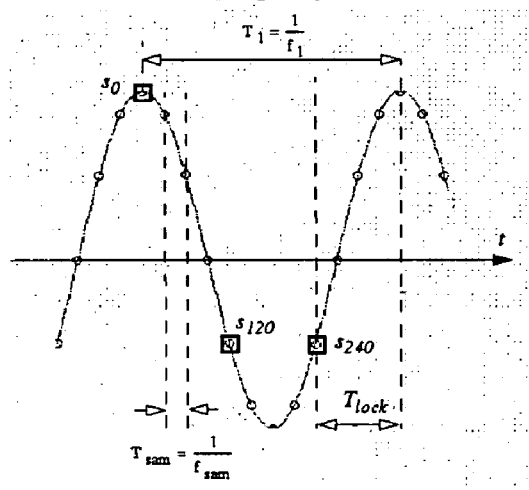
FIG. 14 illustrates an input signal for $N_s=12$ where $s_0$, $s_{120}$, and, $s_{240}$ are shown as squares.

The input signal is sampled at a rate of $f_{sam}$ by the data acquisition module. The 120°-samples ($s_0$, $s_{120}$, and, $s_{240}$) are collected by the accumulator during the first ⅔ of one the input fundamental component cycle. FIG. 14 shows the input signal for $N_s$=12 where this value is selected for ease of demonstration and $s_0$, $s_{120}$, and, $s_{240}$ are shown as squares.

The computation of the synchronization information starts immediately after $s_0$, $s_{120}$, and, $s_{240}$ are accumulated. The computation begins ⅔ of the way through a period of the input fundamental component ($T_1$) under steady state conditions. The remaining ⅓ of the period, from $s_{240}$ of the current period to $s_0$ of the next period, is referred to as the lock-time ($T_{lock}$), hence, $$T_{lock} = \frac{T_1}{3}. \tag{46}$$

During $T_{lock}$, the PPLL phase locking mechanism is performed and hence the name "lock-time" is selected. The following events occur during $T_{lock}$:

No samples are collected,

Synchronization information is computed, and

Phase locking of the PPLL is achieved.

During the occurrence of a frequency/phase change, $\Phi_{Diff}$ becomes nonzero. $\Phi_{Diff}$ is forced to zero by retarding or advancing the tracking signal with respect to the input fundamental component. The retardation/advancement is achieved by adjusting $T_{lock}$ where $$T_{lock} = \frac{1}{3} T_1 + t_{RA}, \tag{47}$$

and $t_{RA}$ is the retard/advance time.

$t_{RA}$ is related to the phase-difference by the following expression $$t_{RA} = \frac{\phi_{Diff}}{2 \cdot \pi} \cdot T_1. \tag{48}$$

The period of the input fundamental component is related to the sampling period by the number of samples per period ($N_s$) as $$T_1 = N_s \cdot T_{sam}. \tag{49}$$

Combining (47), (48), and (49) results in $$T_{lock} = N_s T_{sam} \cdot \left( \frac{1}{3} + \frac{\phi_{Diff}}{2 \cdot \pi} \right). \tag{50}$$

The expression in (50) provides the time remaining from the acquisition of $s_{240}$ until the arrival of $s_0$ associated with the next period. Therefore, a reduction in $T_{lock}$ causes an advancement of the tracking signal by starting the next period earlier while an increase of $T_{lock}$ delays the start of the next period.

The minimum and maximum values of the lock-time ($T_{lock}$) determine the operating range for retardation/advancement of the tracking signal and are described below.

The expression (50) refers to the value of $T_{lock}$ required to advance, to retard, or not to change the tracking signal so that $\Phi_{Diff}$ is forced to zero. The three possibilities are explained below.

Advance Tracking Signal. A negative $\Phi_{Diff}$ occurs when $f_1$ increases. The increase in $f_1$ leads to a decrease in $T_{lock}$ such that the start of the next cycle of the tracking signal is advanced in order to coincide with $s_0$ of the three-sample cosine-wave. The minimum $T_{lock}$ is given by $$\lim_{f_1 \to \infty} T_{lockMin}(f_1) = 0. \tag{51}$$

In practice, the algorithm takes a finite amount of time ($t_p$) to computer $f_1$, $A_1$, and $\Phi_{Diff}$, consequently, the minimum that $T_{lock}$ can be decreased by is $$T_{lockMin} = t_p. \tag{52}$$

Steady State (No Change Required). Under steady state operating conditions, $\Phi_{Diff}$ is zero and hence $T_{lock}$ is exactly equal to ⅓ of the current input signal period. Thus, no retardation/advancement is required. As a result, the phase-shifter module waits for $T_1/3$ which is the same as the previous prediction period and the tracking signal is not changed.

Retard Tracking Signal. A positive nonzero $\Phi_{Diff}$ occurs when $f_1$ decreases. The decrease in $f_1$ leads to an increase in $T_{lock}$ such that the start of the next cycle of the tracking signal is retarded in order to coincide with so of the three-sample cosine-wave. The maximum time that $T_{lock}$ can be increased by is $$\lim_{f_1 \to 0} T_{lockMax}(f_1) = \infty. \tag{53}$$

The tracking signal and the input fundamental component are represented in a direct (d-) and quadrature (q-) axis. Hence, the transformed tracking signal and the transformed input fundamental component are referred to as tracking frame and fundamental frame respectively. The fundamental frame is aligned with the input fundamental component such that the sample so, falls on the d-axis and $s_{120}$, and $s_{240}$ are located at 120° and 240° respectively. Similarly, the tracking frame is aligned with the tracking signal where $x_0$ falls on the D-axis and $x_{120}$, and $x_{240}$ are located at 120° and 240° respectively.

Figure 15:
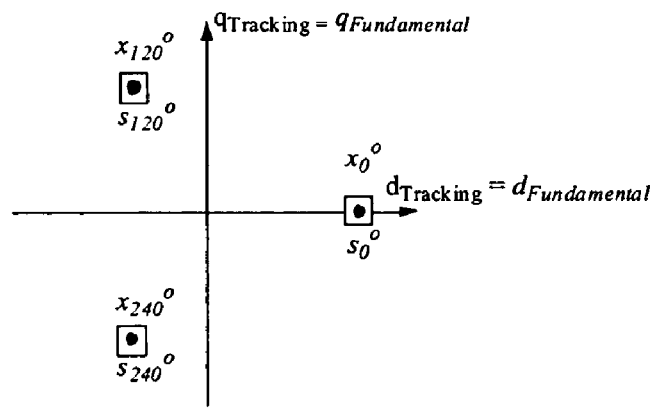
FIG. 15 illustrates tracking and input frames during steady state.

FIG. 15 shows the tracking and input frames during steady state operation where $s_0$, $s_{120}$, and, $s_{240}$ are aligned with $x_0$, $x_{120}$, and $x_{240}$ respectively and the axes overlap.

Figure 16:
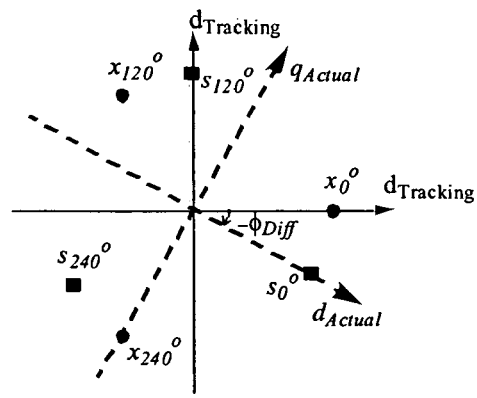
FIG. 16 illustrates the tracking and input frames with a nonzero $\Phi_{Diff}$.

Any change in frequency or phase of the input fundamental component causes the tracking frame to lag or lead the fundamental frame and hence $\Phi_{Diff}$ becomes nonzero. An example of a nonzero $\Phi_{Diff}$ is shown in FIG. 16.

The PPLL achieves synchronization by retarding/advancing the tracking frame until it is aligned with the fundamental frame. For instance, in FIG. 12, steady state is achieved by advancing the tracking frame in a clockwise direction until $\Phi_{Diff} = 0$.

Implementation and Experimental Results

The implementation of the wide-range synchronization system (WSS) along with the experimental results will now be described. Two platforms are described:

A microprocessor based platform consisting of a digital signal processor TMS320C31 manufactured by Texas Instruments [14].

A field programmable gate array (FPGA) based platform comprised of a FPGA device mounted on a Xilinx development kit [15].

The microprocessor platform is used to develop a systematic strategy for the implementation of the WSS for the following reasons:

Fast compiling time is offered in configuring microprocessors as opposed to FPGAs (i.e. a few minutes to compile the software programs and configure the microprocessor as opposed to a few hours for FPGA), and Provides a simple means of comparison and evaluation of the WSS with other synchronization methods.

The FPGA platform is employed due to the ability to perform a gate level design. A gate level design permits performance optimization in terms of execution speed and real estate utilization as well as providing the designer with the added flexibility of adding a parallel processing capability. Moreover, a gate level design on a FPGA facilitates a future system-on-chip (SOC) implementation. A SOC implementation allows faster operational speeds and lowers the total cost if the market demand is large enough to justify the initial development cost.

Evaluation Signals

The evaluation signals employed to determine the performance of the WSS will now be described. The evaluation signals consist of the input signal, synchronization signal, and the pulse signal as described below.

Input Signal. The method used to generate the input signal (x(t)) will now be described. x(t) is defined above and is restated below $$x(t) = s_1(t) + n(t), \tag{54}$$

where $s_1(t)$ is the input fundamental component and n(t) represents any undesired components such as a DC offset, harmonics/inter-harmonics, and noise.

Typically the power utility system is primarily a sinusoidal waveform represented by $s_1(t)$. However, $s_1(t)$ has harmonics and/or noise contamination superimposed on it. It is necessary to investigate the performance of the WSS with waveforms that typically characterize the power systems and power electronics environments. Unfortunately, it is difficult to emulate the power line disturbance conditions precisely. Therefore, signals which are easy to generate with a function generator or a microprocessor based system and which in principle are worse than what would appear on a power line are employed. The equipment used to generate the test signals are described as follows:

A function generator is employed to generate sinusoidal, square, and triangular waveforms with a variable frequency and/or amplitude.

A microprocessor platform is used for the following reasons:

To generate sinusoidal waveforms with superimposed harmonics/inter-harmonics, and To generate triggering signals so as to facilitate event capturing by the oscilloscope.

Figure 17:
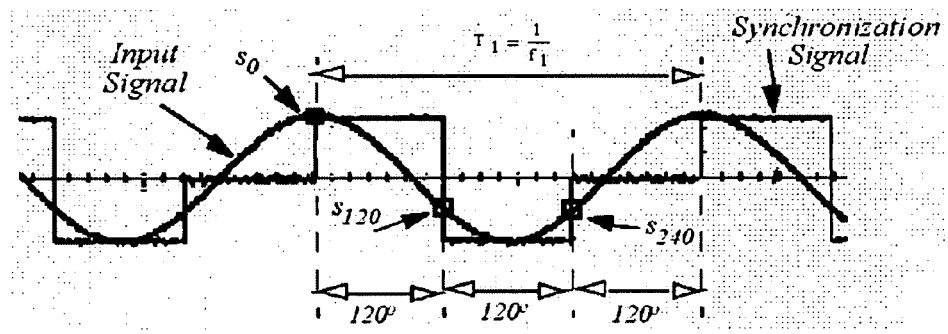
FIG. 17 illustrates the input signal and the synchronization signal.

Synchronization Signal. As described above, the WSS generates a synchronization signal that provides synchronization information related to the input signal. The introduced synchronization signal is either aligned with the positive zero crossing or the positive peak. As described below, a synchronization signal is considered with rising and falling edges aligned to the three 120°-samples ($s_0$, $s_{120}$, and $s_{240}$) as shown in FIG. 17. This type of synchronization signal is advantageous for trouble shooting the WSS algorithm.

Pulse Signal. A pulse signal is generated by a function generator or a microprocessor. The pulse signal is used to evaluate the tracking performance of the WSS.

In a phase locked loop (PLL), an error signal is an internal signal generated by comparing the phase between an input signal and an oscillator. The existing synchronization methods are typically based on a PLL architecture and employ the error signal generated by the PLL to evaluate the performance of the synchronization algorithm [4, 2, 1]. The error signal is a by-product of the same synchronization algorithm under test. The accuracy of the error signal depends upon the accuracy of the algorithm itself and hence affects the evaluation outcome. As a result, the use of the error signal generated by the same algorithm under test affects the algorithm evaluation results. The approach selected is to verify the performance of the synchronization system by a signal that is independent of the algorithm under test.

Figure 18:
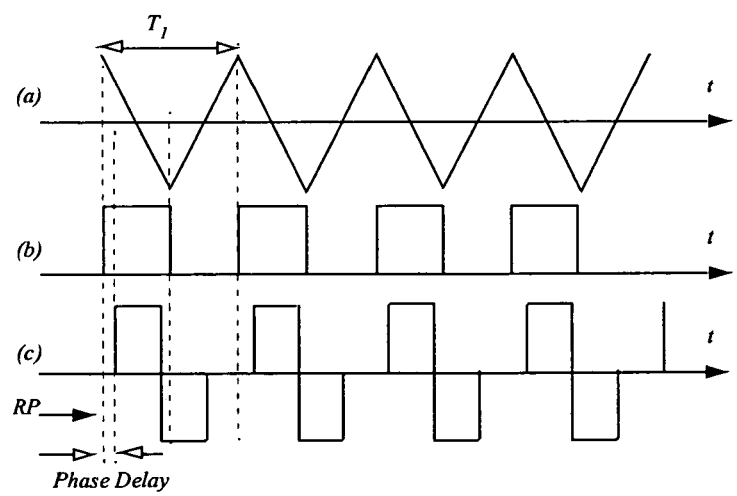
FIG. 18 illustrates (a) an input signal, (b) pulse signal, and (c) the synchronization signal with and arbitrary phase delay.

A pulse signal considered for the test of the WSS is shown in FIG. 18(b). FIGS. 18(a) and (c) show an arbitrary triangular input signal and the synchronization signal from the WSS respectively. The pulse signal is generated by:

A function generator—that generates a pulse signal where the rising edge of the pulse signal is aligned with the positive zero crossing or the peak value of the waveform generated by the function generator, and A microprocessor—that is configured to generate the input signal for testing of the WSS and at the same time to generate a pulse signal whose rising edge is aligned with the zero crossing or peak value of the generated input signal.

The delay between the rising edges of the pulse signal and the synchronization signal is considered as the phase delay. A zero phase delay indicates that the WSS determined exactly the synchronization reference-point. The pulse signal provides precise information about the reference-point (RP) since it is generated by the same equipment or the algorithm that generates the test waveforms.

Implementation Strategy

A three stage implementation strategy that may be used to facilitate troubleshooting and the WSS design will now be described. Each stage is divided into smaller modules that can be tested individually and optimized for execution speed.

Stage One. The WSS is implemented by considering a pure sinusoidal input signal. As a result, the data acquisition (DA) module can be simplified by postponing the design of the fundamental sample extractor (FSE). Furthermore, this stage is implemented by considering the sub-modules one at a time. For instance, the DA, including the analog to digital converter (ADC) and the adaptive down sampler (ADS) are implemented and tested separately. Similarly, each sub-module and the entire processor is implemented and tested individually. Finally, the entire WSS, excluding the FSE, is implemented and tested.

Stage Two. The design and test of the FSE including the finite impulse response (FIR) band-pass filter (FIR-BPF) are performed at this stage.

As mentioned above, it is desirable to minimize the time required for one input sample to reach the output of the filter such that the execution speed of the PPLL is maximized. Therefore, the size of the sample window is minimized by equating it to one period of the input fundamental component resulting in equation (26) restated below as $$N_{Filt} = N_s, \quad (55)$$

where $N_{Filt}$ and $N_s$ are the filter order and the number of samples per period of the input signal respectively.

The filter order and the coefficients of the FIR-BPF are determined by simulating a sinusoidal waveform superimposed with noise and harmonics/inter-harmonics in Matlab. The Matlab generated coefficients are used to design, verify, and test the performance of the FIR-BPF. The result for the design of the FIR-BPF is summarized in the following table:

| | |
|---|---|
| Attenuation | 70 dB |
| Filter order ($N_{Filt}$) | 180 |
| Number of samples per period ($N_s$) | 180 |
| Window function | Hamming |

Finally, the FIR-BPF is combined with the state re-initialization and decimator sub-modules to form the complete FSE that is implemented and tested.

Stage Three. The complete WSS design is considered by combining the FSE designed in stage two with the WSS from stage one. The resulting WSS is tested for different input signals with different shapes, amplitudes, frequencies, harmonic content, and/or noise levels.

Microprocessor Platform

The microprocessor platform is manufactured by dSPACE and includes a TMS320C31 processor manufactured by Texas Instruments [14]. The TMS320C31 processor is a 32-bit floating point processor with a clock period of 33 ns. The dSPACE platform offers four 12-bit ADCs and four 12-bit DACs as well as two timers. One of the timers is used for measurements of the sampling period ($T_{sam}$).

Figure 19A:
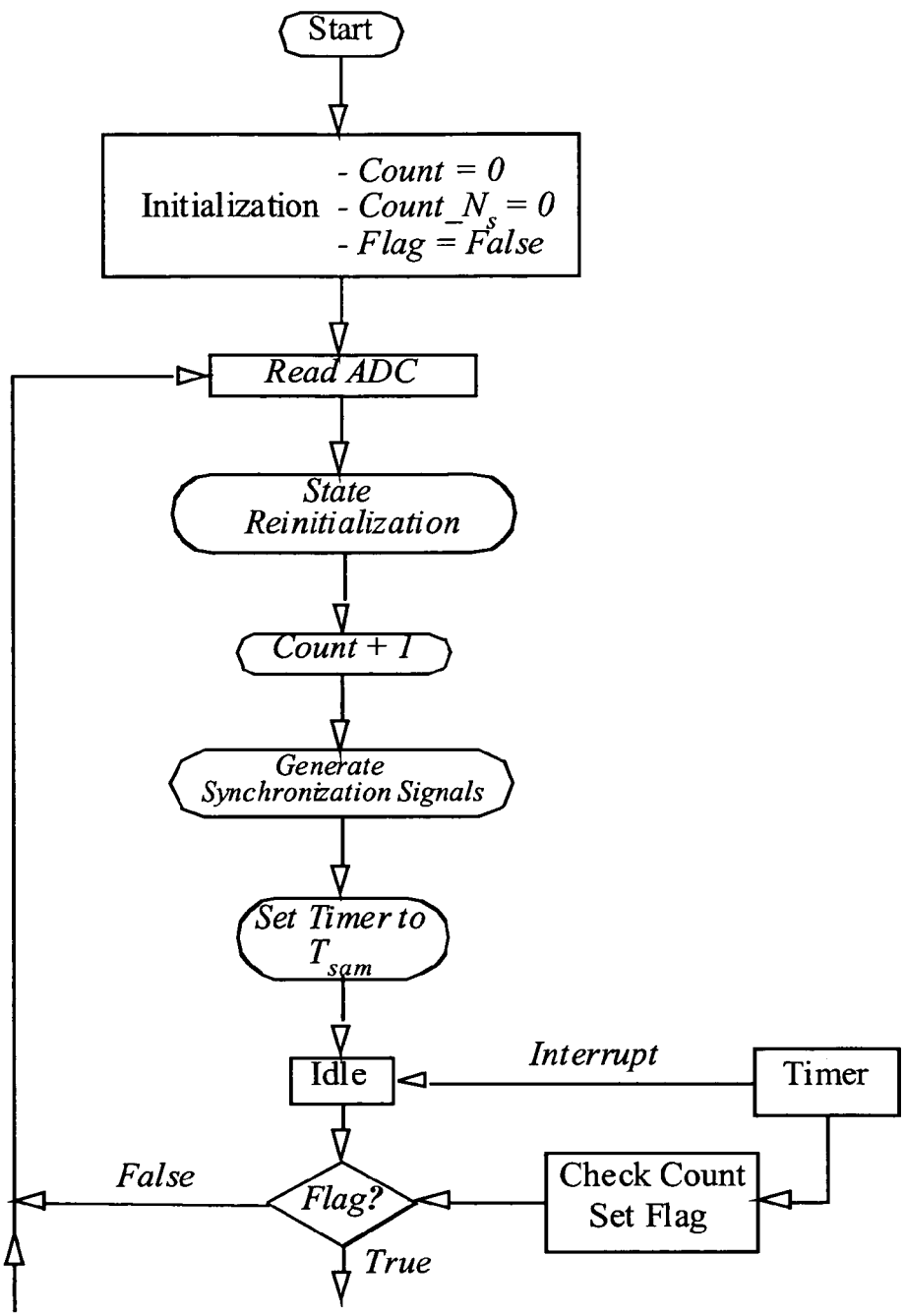
FIGS. 19A and 19B illustrate an implementation flow chart for a WSS according to one embodiment the present application.
Figure 19B:
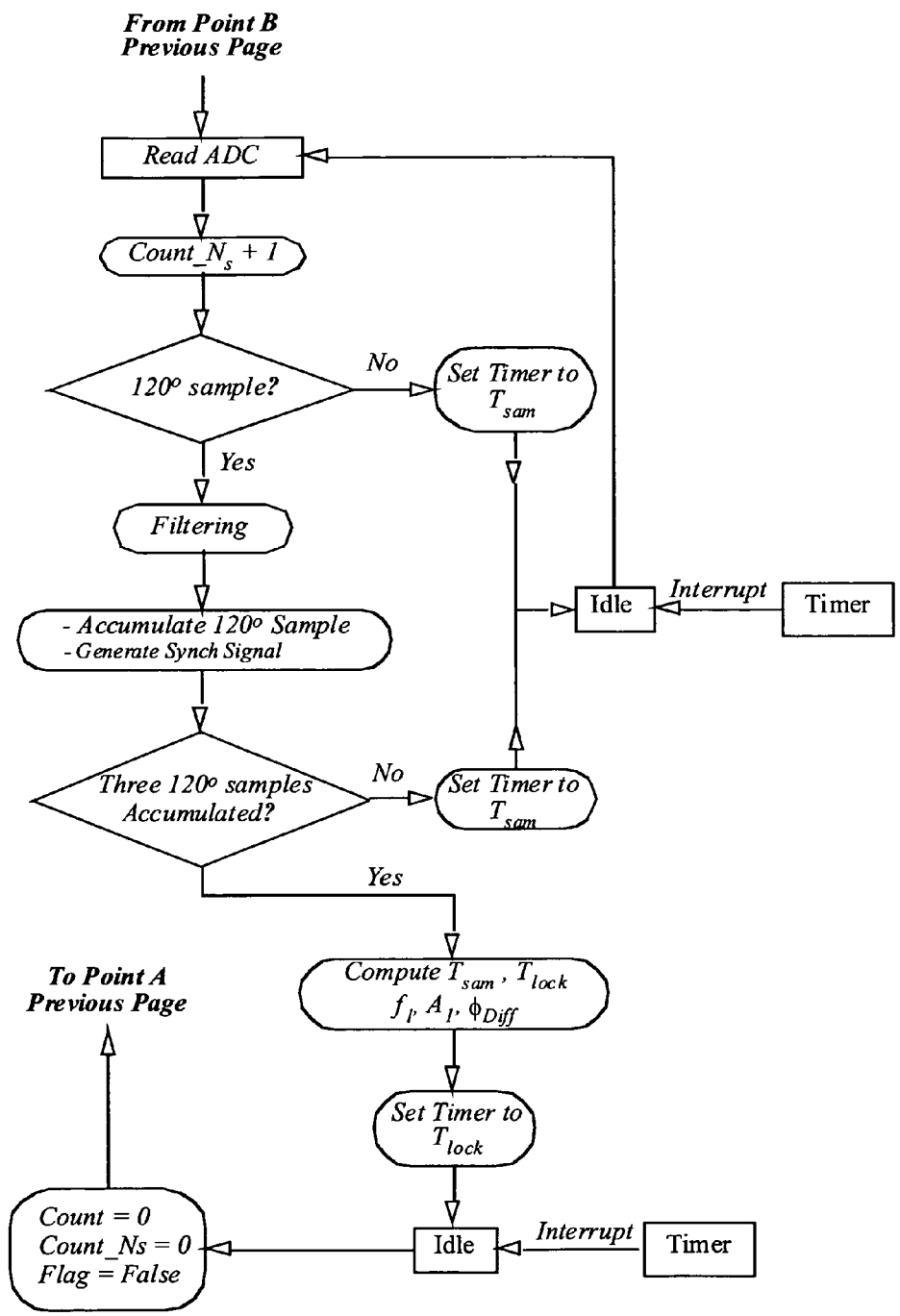

The algorithm flowchart of the WSS is shown in FIG. 19A-B. FIG. 19A illustrates the algorithm during the re-initialization of the sample window as described in above. During re-initialization, the samples are acquired by the ADC and then the state variables are reinitialized, the timing signals are generated, and the timer is set to the current value of the sampling period ($T_{sam}$). The interrupt subroutine checks the count value so as to determine whether the re-initialization is complete. If the flag is set to true then the re-initialization is terminated and the filtering commences. The code for programming the microprocessor is written in the C language.

The filtering of the three 120°-samples is shown in FIG. 19B. The input fundamental component is then down-sampled into the three 120°-samples by the decimator. Furthermore, the sampling period, lock-time, the input fundamental component frequency ($f_1$), amplitude ($A_1$), and phase-difference ($\Phi_{Diff}$) are computed and the timer is set to the lock-time ($T_{lock}$).

Field Programmable Gate Array (FPGA) Platform

The FPGA implementation of the WSS will now be described. The FPGA platform allows a gate level design as well as parallel processing that leads to higher execution speeds as compared to the microprocessor platform.

Figure 20:
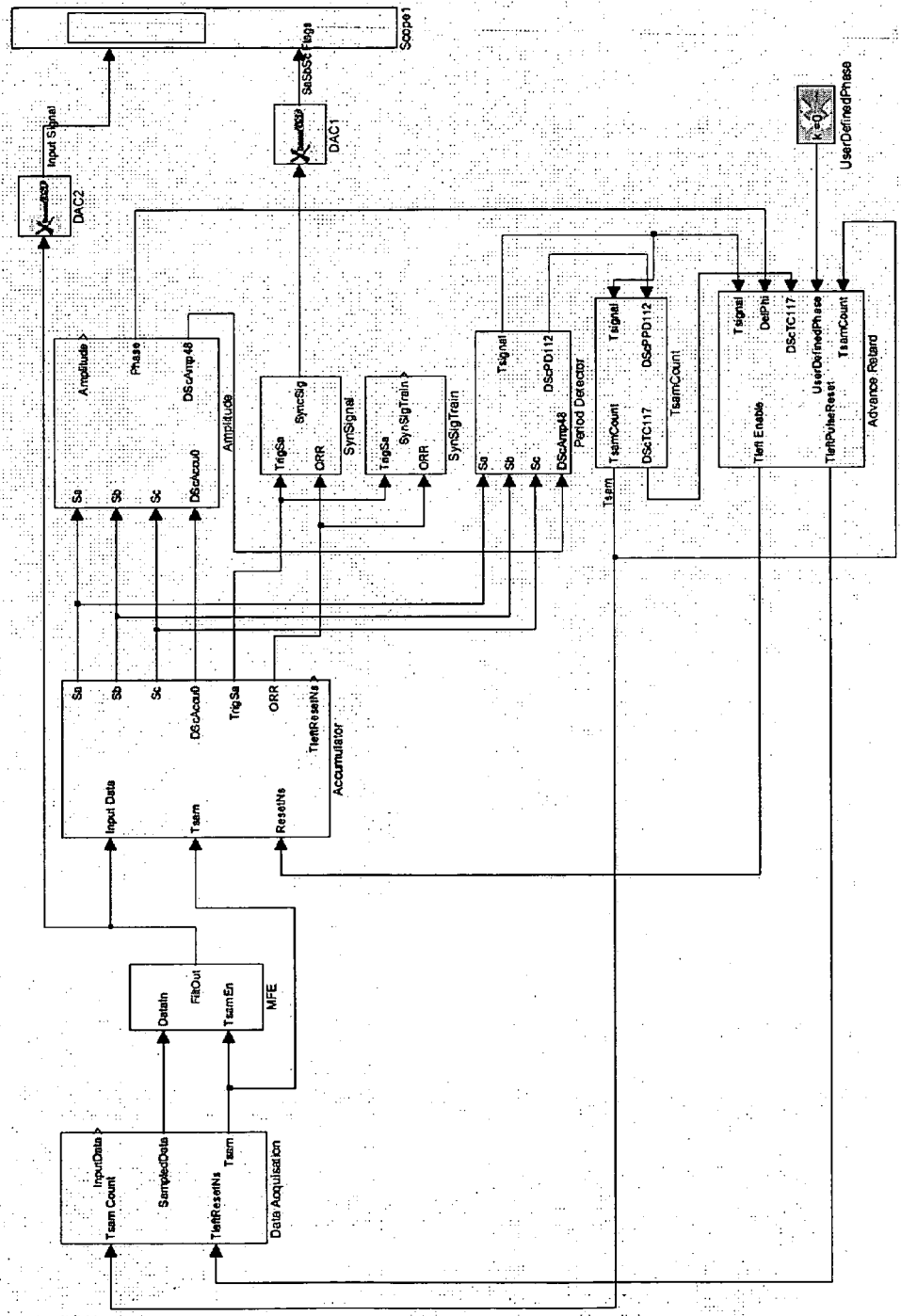
FIG. 20 illustrates a hierarchical block diagram for a field programmable gate array (FPGA) implementation.

The WSS is implemented in a FPGA using the XtremeDSP development kit [15] and Xilinx system generator for DSP. This development kit consists of a FPGA device from the Virtex-II family (XC2V2000-4FG676) manufactured by Xilinx with 56 embedded multipliers. The FPGA device offers two million gates where only about 25% are utilized in implementation of the WSS indicating small real estate requirement and hence low power dissipation. The development kit also includes one dual-channel, 14-bit analog to digital converter and one dual-channel, 14-bit digital to analog converter. A block diagram of the WSS implementation using the Xilinx FPGA is shown in FIG. 20. The following table summarizes the resources utilized in the FPGA implementation of the WSS.

| Name | Used | Total Available | Percentage (%) |
|---|---|---|---|
| Flip Flops | 7,638 | 21,504 | 35 |
| LUTs | 7,087 | 21,504 | 32 |
| Slices | 5,483 | 10,752 | 50 |
| Block RAMs | 3 | 56 | 5 |
| Multipliers | 24 | 56 | 42 |
| Equivalent Gate Count | 487,156 | 2,000,000 | 25 |

Results. The implementation results will now be described. The input signal as explained above was either generated by the microprocessor platform or the function generators. The synchronization signal generated by the WSS was compared with the pulse signal and the phase-jitter was measured in addition to the extracted input fundamental component. The experimental results are considered for two sets of operating conditions: steady state and transients. The steady state and transient performance of the WSS were considered for a contaminated sinusoidal signal with harmonics. In addition, triangular and square waveforms are generated by the function generator and employed to investigate the performance behavior of the WSS under distorted line conditions.

The experimental waveforms are captured using an oscilloscope where the names/values of the measured signals are adjacent to the Figures, and the notations are described in the following table.

| SYMBOL | DESCRIPTION |
|---|---|
| $f_1$ | Frequency of input fundamental component extracted |
| $A_1$ | Amplitude of input fundamental component extracted |
| $f_{Input}$ | Frequency of input signal |
| $A_{Input}$ | Amplitude of input signal |
| $\Phi_{USPO}$ | User-specified phase-offset |

Steady State. The steady state operating results will now be described where channel 3 and 1 indicate the input and the synchronization signals respectively and channel 2 shows the input fundamental component.

Figure 21:
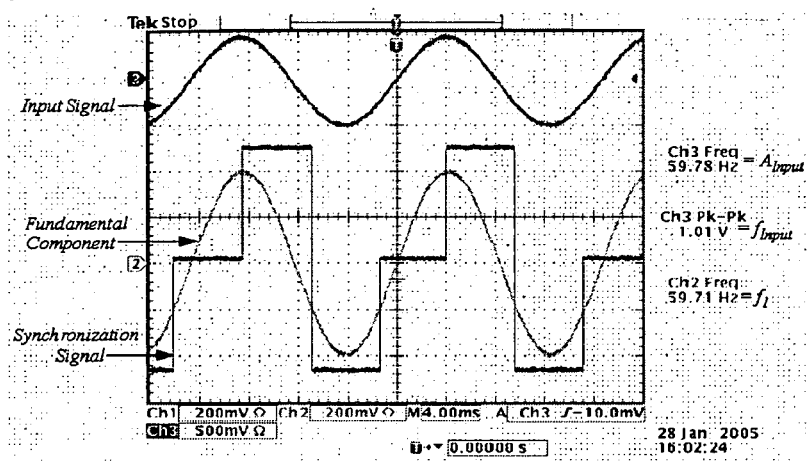
FIG. 21 illustrates a steady state sinusoidal input signal at 60 Hz.

Frequency. Two sets of frequencies are considered as follows:

Utility network: 60 Hz is shown in FIG. 21 and

Figure 22:
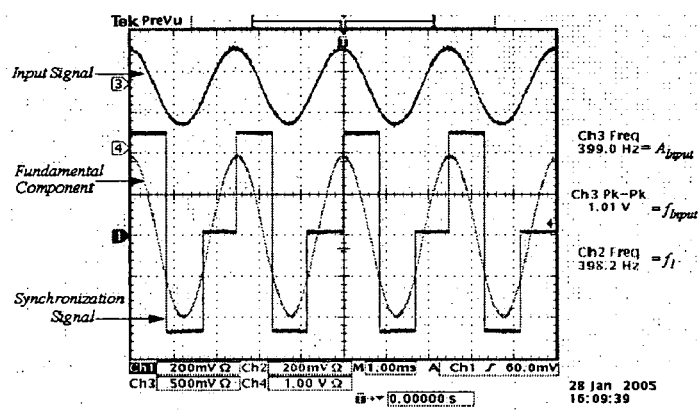
FIG. 22 illustrates a steady state sinusoidal input signal at 400 Hz.
Figure 23:
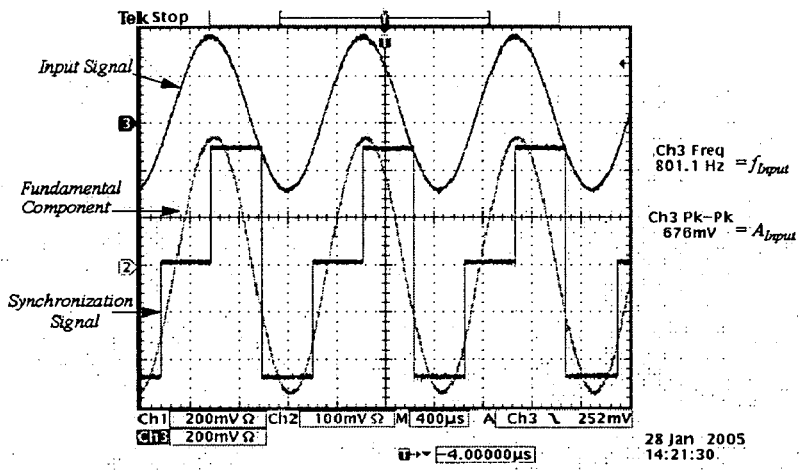
FIG. 23 illustrates a steady state sinusoidal input signal at 800 Hz.

Airplane electric power network: 400 Hz (constant frequency) and 800 Hz (maximum of variable frequency) are shown in FIGS. 22 and 23 respectively.

Figure 24:
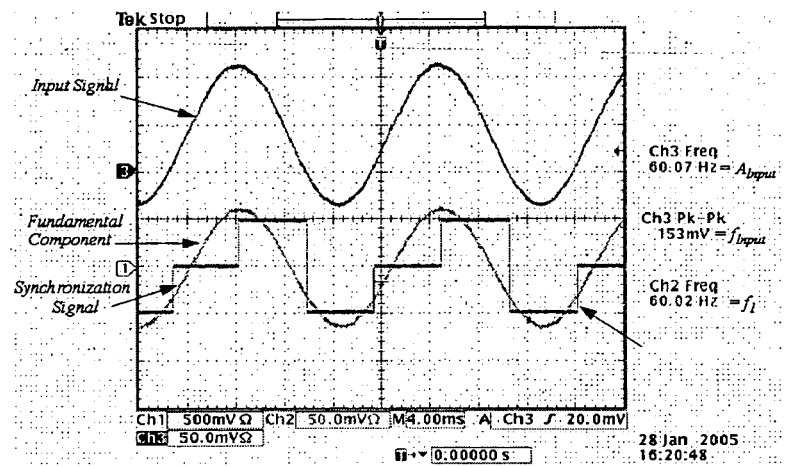
FIG. 24 illustrates a steady state sinusoidal input signal with a 0.15 volt p-p amplitude at 60 Hz.

Amplitude. The WSS is tested for a minimum amplitude of 0.15 volts p-p as shown in FIG. 24. The 0.15 volts p-p is approximately 4% of nominal value of 3.6 volts p-p. The minimum value used is due to limitations of the function generator.

Harmonics. The experimental results of the WSS in the presence of harmonics will now be described. A frequency domain representation is obtained by employing the Fast Fourier transform (FFT) using the math function of the oscilloscope.

Figure 25:
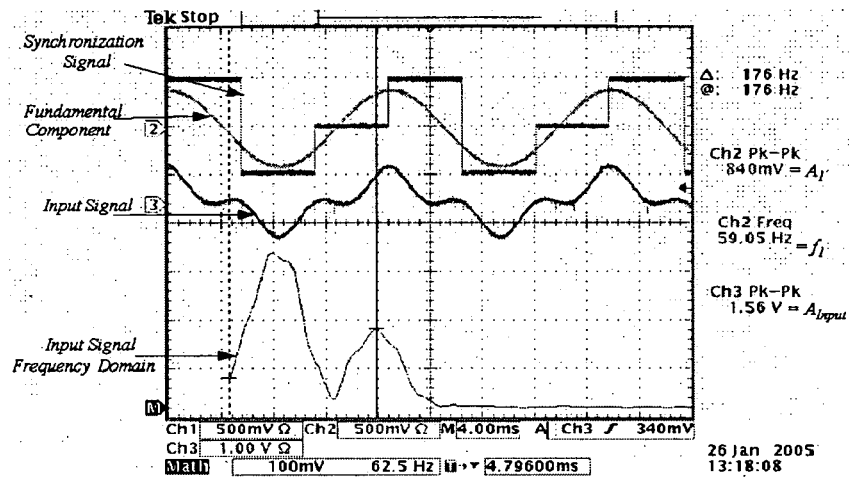
FIG. 25 illustrates an input signal with fundamental and $3^{rd}$ harmonic at 60 Hz where channel M represents the input signal in the frequency domain.
Figure 26:
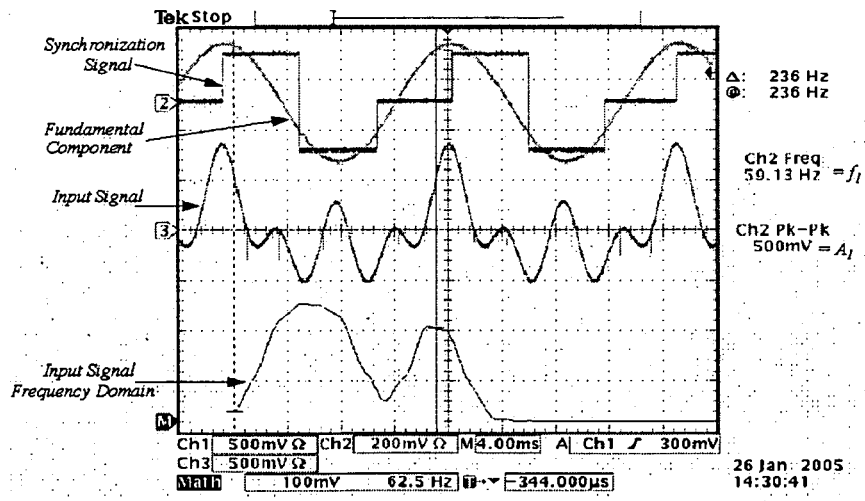
FIG. 26 illustrates an input signal with fundamental and $4^{th}$ harmonic at 60 Hz where channel M represents the input signal in the frequency domain.
Figure 27:
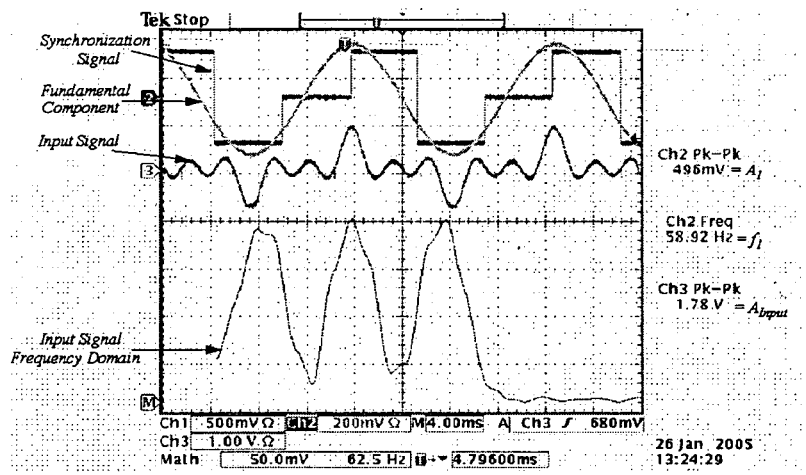
FIG. 27 illustrates an input signal with fundamental, $3^{rd}$ and $5^{th}$ harmonics at 60 Hz where channel M represents the input signal in the frequency domain.
Figure 28:
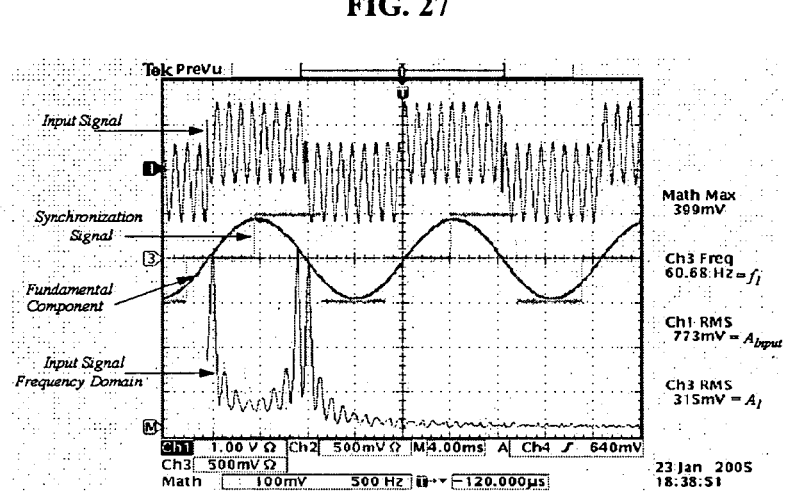
FIG. 28 illustrates a square wave input signal at 60 Hz with severe amplitude modulation where channel M represents the input signal in the frequency domain.

FIGS. 25, 26 and 27 show input signals at 60 Hz consisting (a) the fundamental and $3^{rd}$ harmonic, (b) the fundamental and $4^{th}$ harmonic, and (c) the fundamental, $3^{rd}$, and $5^{th}$ harmonics respectively. FIG. 28 illustrates a square wave with amplitude modulation at 60 Hz.

Figure 29:
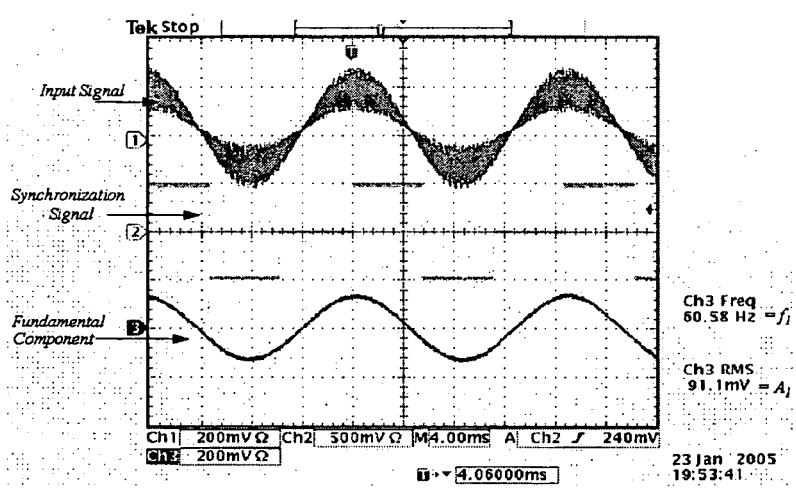
FIG. 29 illustrates an input signal with superimposed noise.

Noise. The noise performance of the WSS is tested using the noise function available from a function generator. FIG. 29 shows a sinusoidal waveform with superimposed noise. The magnitude of the noise is equal to 60% of the magnitude of the input signal.

Figure 30:
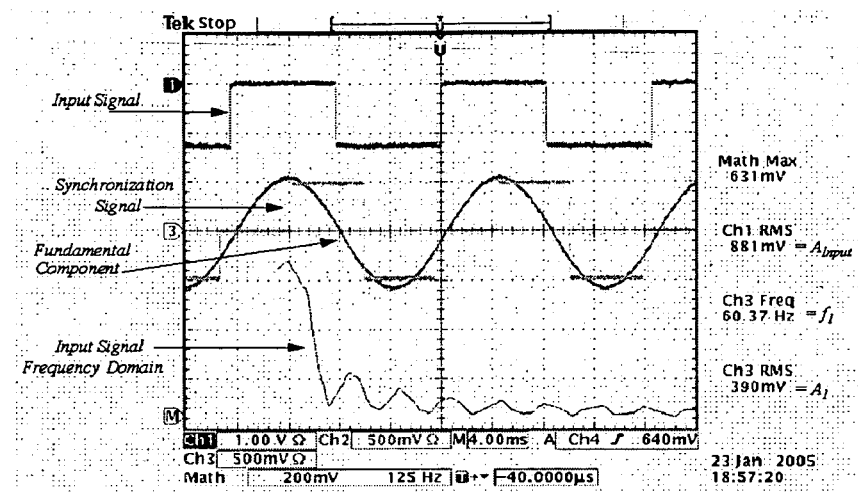
FIG. 30 illustrates a square wave input signal with DC offset at 60 Hz where channel M represents the input signal in the frequency domain.
Figure 31:
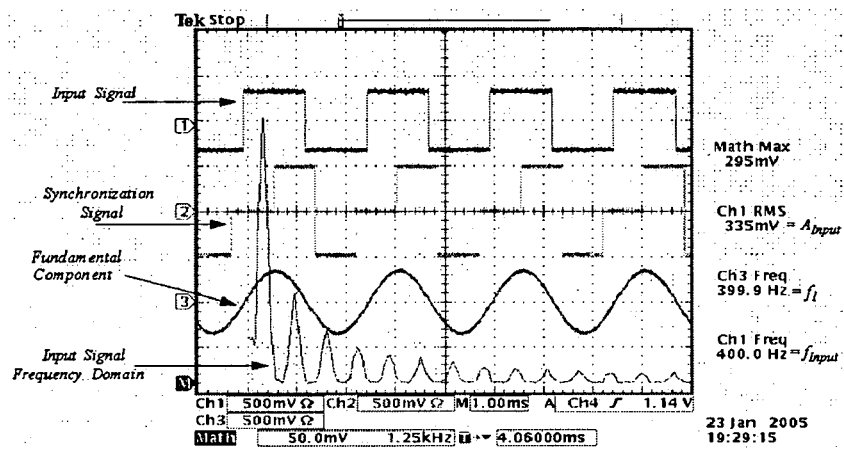
FIG. 31 illustrates a square wave input signal at 400 Hz where channel M represents the input signal in the frequency domain.
Figure 32:
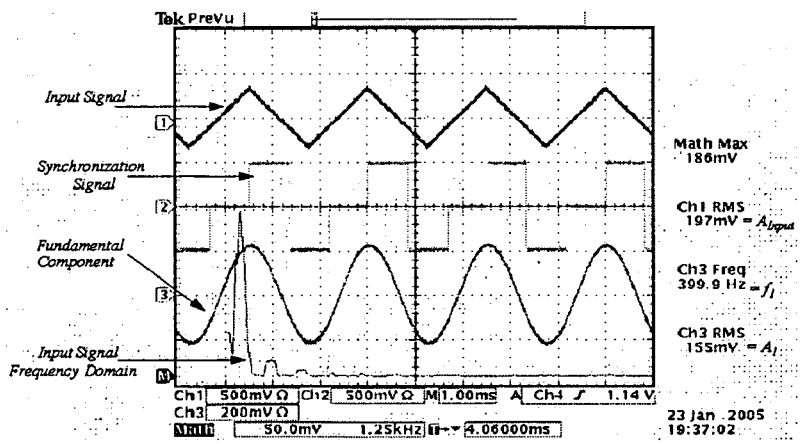
FIG. 32 illustrates a triangular input signal at 400 Hz where channel M represents the input signal in the frequency domain.

Different Waveforms. Triangular and square waveforms include odd and even harmonics respectively. The function generators typically generate triangular and square waveforms and hence these waveforms are employed to verify the noise performance of the WSS. FIGS. 30 and 31 illustrate square wave input signals at 60 and 400 Hz respectively. FIG. 32 illustrates a triangular input signal at 400 Hz.

Figure 33:
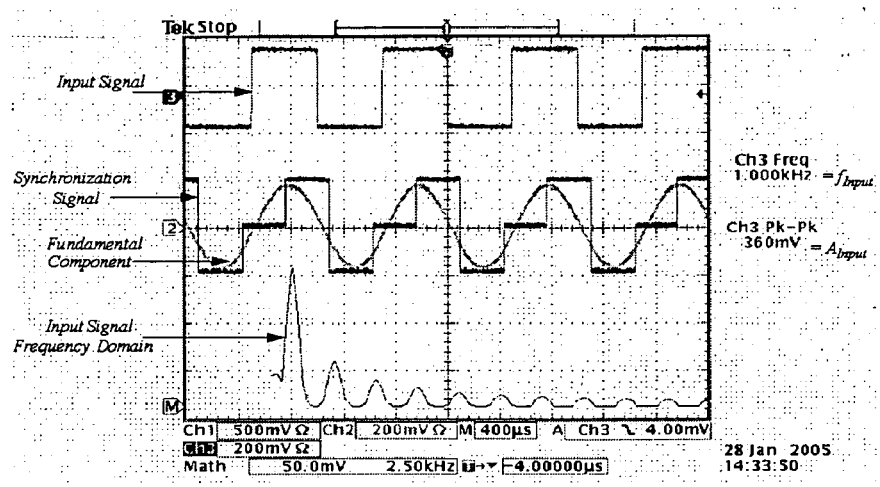
FIG. 33 illustrates a square wave input signal at 1 kHz where channel M represents the input signal in the frequency domain.
Figure 34:
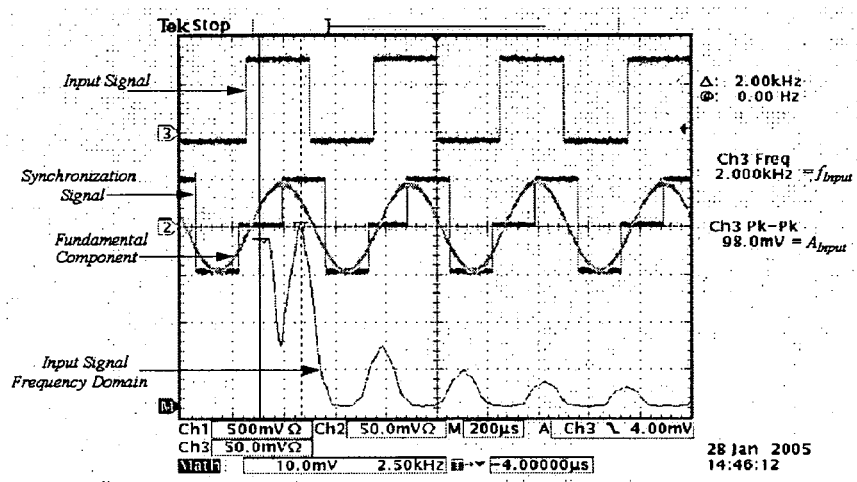
FIG. 34 illustrates a square wave input signal with a 2 kHz frequency, a DC offset and a 0.098 volt amplitude where channel M represents the input signal in frequency domain.

Frequency Range. The frequency range was examined under severe conditions of distortion and minimum amplitude. FIGS. 33 and 34 show square wave input signals with a frequency of 1 and 2 kHz respectively. FIG. 34 illustrates a square wave with a DC offset.

Figure 35:
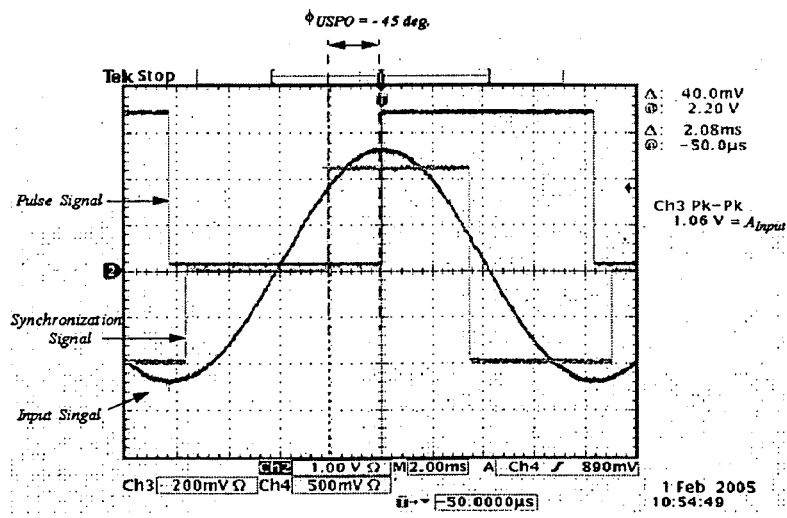
FIG. 35 illustrates a user introduced user-specified phase-offset (USPO) of 45° for a 60 Hz input signal.

User-Defined Phase-Offset. The user-defined phase-offset is set to an arbitrary value of 45° with respect to the positive peak reference-point (RP) in FIG. 35.

Experimental results for the WSS under transient conditions for frequency, amplitude, and phase will now be described. The frequency, amplitude, and phase were stepped up/down by applying a sudden increase followed by a sudden decrease in the frequency/amplitude/phase of the input signal. The frequency and amplitude were linearly ramped up/down by gradually varying the frequency/amplitude where the frequency change traces a triangular pattern.

Figure 36:
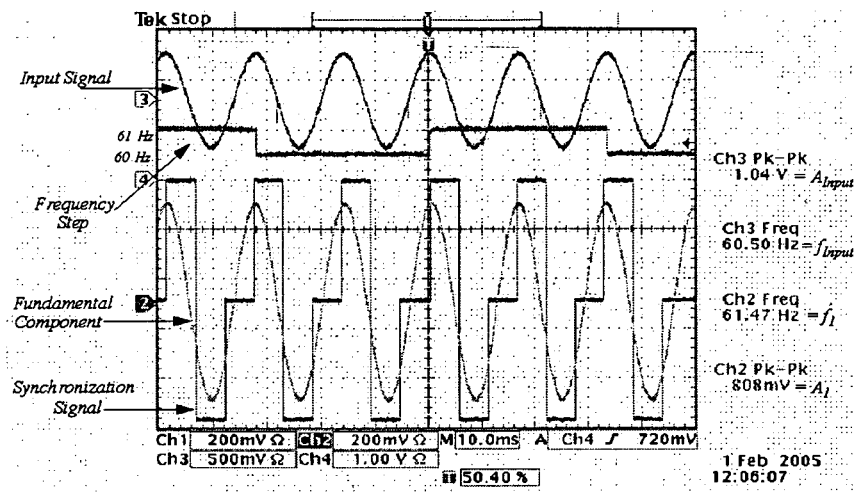
FIG. 36 illustrates a frequency step change of 1 Hz from a 60 Hz operating point.
Figure 37:
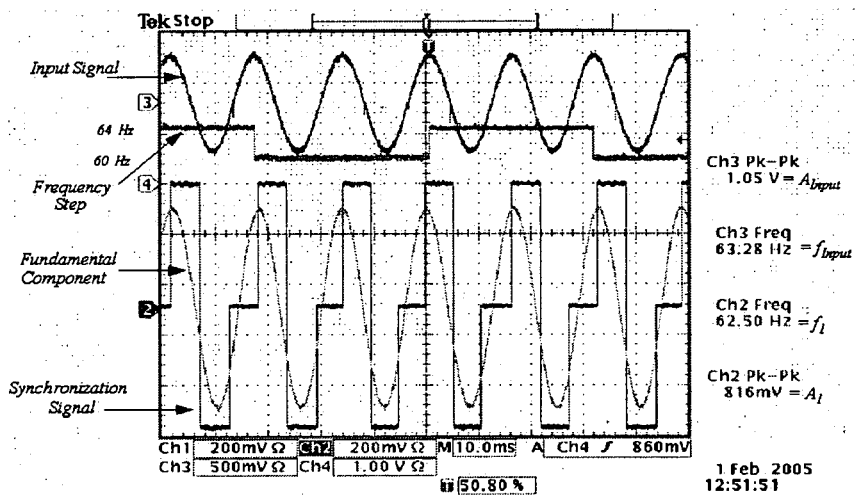
FIG. 37 illustrates a frequency step change of 4 Hz from a 60 Hz operating point.
Figure 38:
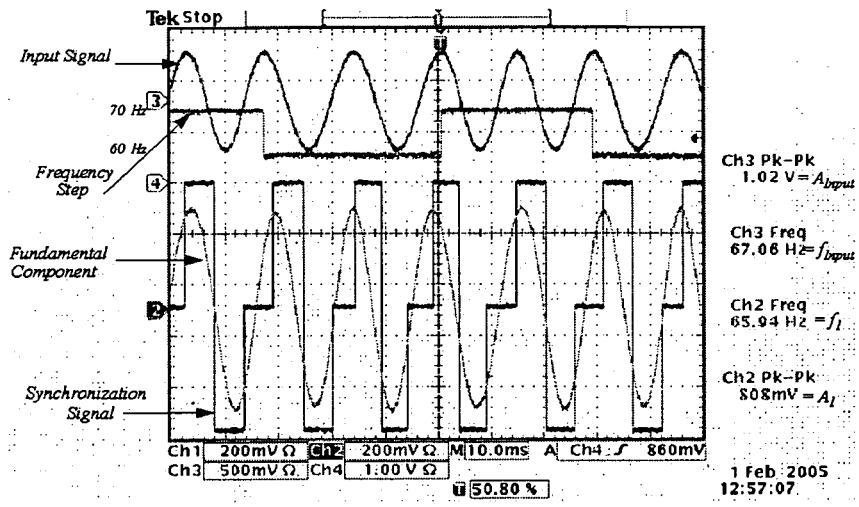
FIG. 38 illustrates a frequency step change of 10 Hz from a 60 Hz operating point.

Frequency Step. The frequency response of the WSS to step changes in frequency is presented in FIG. 36 to 38. In FIG. 36 to 38, channel 4 indicates the value of the frequency as it steps up/down. FIG. 36-38 illustrate frequency step changes of 1 Hz, 4 Hz, and 10 Hz from an operating point of 60 Hz respectively.

Figure 39:
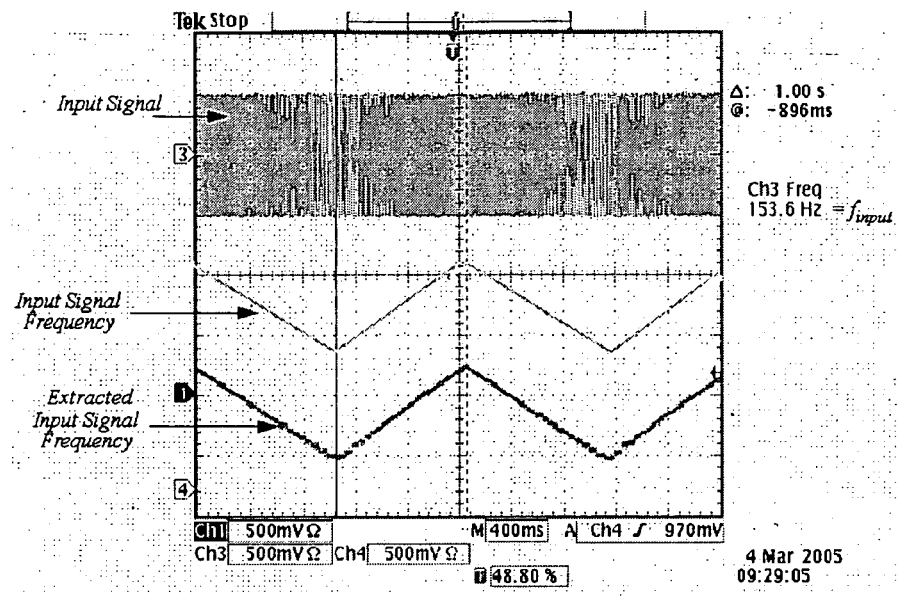
FIG. 39 illustrates a response of one embodiment of a WSS to a 120 Hz/sec change in the input signal frequency.

Frequency Ramp. The WSS is tested under conditions that the frequency of the input signal is ramped up/down following the shape of a triangular path. FIG. 39 illustrates a frequency ramp with a rate of 120 Hz/sec where the frequency alters between 40 Hz to 160 Hz.

Figure 40:
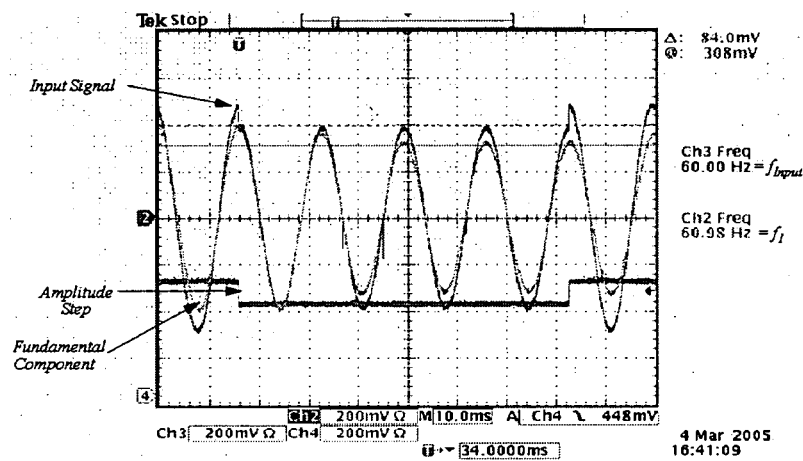
FIG. 40 illustrates an amplitude step change of 20% of the rated value.

Amplitude Step. The amplitude response of the WSS for a step change is presented in FIG. 40. FIG. 40 illustrates results for an amplitude step up/down by 20% where channel 2 illustrates the input fundamental component. Channel 4 shows the step change in magnitude.

Figure 41:
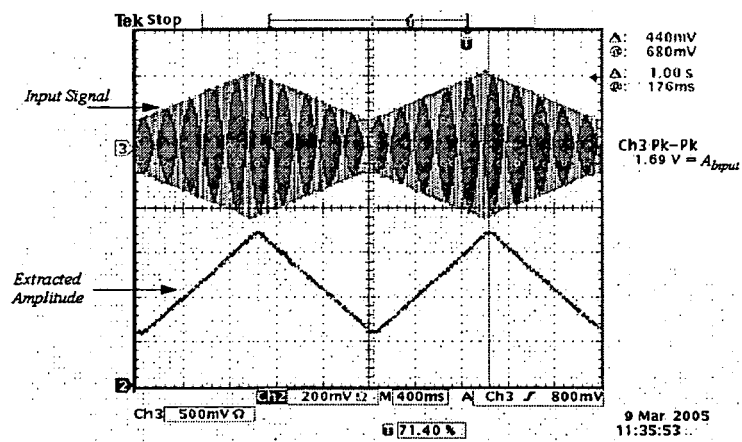
FIG. 41 illustrates a response of one embodiment of a WSS to an amplitude ramp of 0.55 per second.

Amplitude Ramp. The WSS was tested by ramping up/down the amplitude. In FIG. 41, channel 2 and 3 show the extracted amplitude and the input signal respectively. The change in amplitude of the input signal is 0.55 volt per second which is approximately a change of 66% from nominal value of 3.6 volts p-p.

Figure 42:
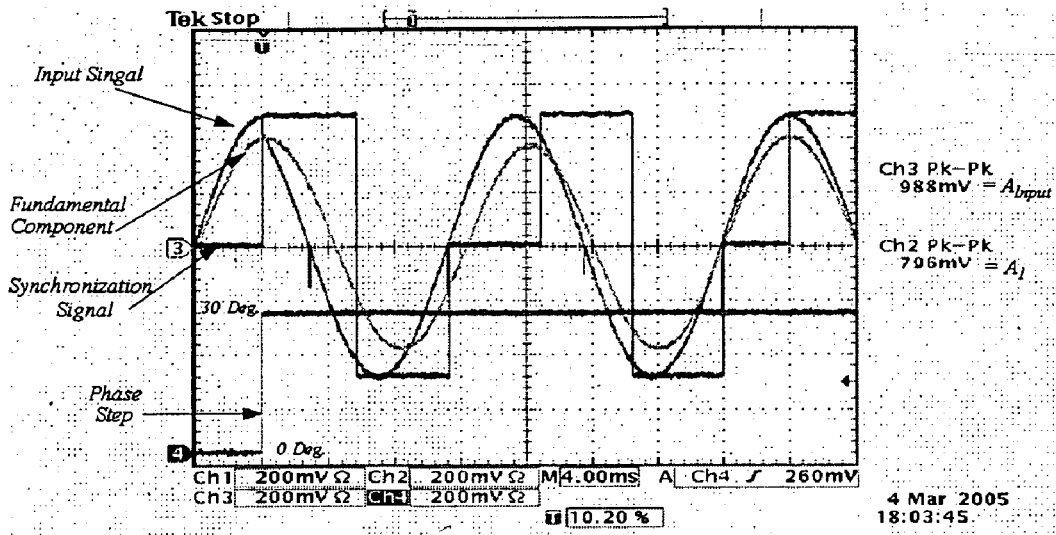
FIG. 42 illustrates a response of one embodiment of a WSS to a phase step of 30°.

Phase Step. The phase step response of the WSS is illustrated in FIG. 42 where a phase step of 300 illustrated.

The embodiments of the application described above are intended to be examples only. Those of skill in the art may effect alterations, modifications and variations to the particular embodiments without departing from the scope of the application. The subject matter described herein in the recited claims intends to cover and embrace all suitable changes in technology.

The invention claimed is:

1. A method for use in a synchronization system having a processor operably connected to a memory for synchronizing an input signal for a power system, comprising:

extracting from the input signal received from the power system, three substantially equidistant samples from a fundamental component of the input signal, the three substantially equidistant samples being taken substantially 120 degrees apart during steady-state operation;

determining a frequency ($f_1$), an amplitude ($A_1$), and a phase-difference ($\Phi_{Diff}$) of the input signal from the three equidistant samples and a tracking signal corresponding to a steady-state of the fundamental component of the input signal characterized by a frequency ($f_{TS}$) and an amplitude ($A_{TS}$) with a phase-difference that is the phase angle between the tracking signal and the input signal;

generating and outputting frequency, amplitude, and phase-difference signals corresponding to the determined frequency ($f_1$), amplitude ($A_1$), and phase-difference ($\Phi_{Diff}$) of the input signal to one or more components of the power system, adjusting the tracking signal to match the determined frequency ($f_1$), amplitude ($A_1$), and phase-difference ($\Phi_{Diff}$) of the input signal; and generating a synchronization signal from the determined frequency ($f_1$) for output to the one or more components of the power system.

2. The method of claim 1, further comprising:

receiving a phase-offset signal including a user-specified phase-offset ($\Phi_{USPO}$) relative to a reference-point from an external user system, the frequency ($f_1$), amplitude ($A_1$), and phase-difference ($\Phi_{Diff}$) being determined from the three equidistant samples, the phase-offset signal, and the tracking signal.

3. The method of claim 2, wherein the reference-point is a positive zero crossing or a positive peak of the input signal, the synchronization signal being aligned with the positive zero crossing or the positive peak.

4. The method of claim 3, wherein the reference-point is a positive peak of the input signal, the synchronization signal being aligned with the positive peak.

5. The method of claim 4, wherein the input signal is one of an alternating current (AC) voltage signal and an AC current signal.

6. The method of claim 5, wherein the amplitude ($A_1$) is determined according to the following expression $$A_1 = \sqrt{s_d^2 + s_q^2}, \quad (13)$$

the phase-difference ($\Phi_{Diff}$) is determined according to the following expression $$\Phi_{Diff} = atan\left(\frac{s_q}{s_d}\right), \quad (14)$$

and the frequency ($f_1$) is determined according to the following expression $$G(f_1) = \quad (17)$$
$$\left|\frac{A_1}{3}\left(\cos\left(2\pi\frac{f_1}{f_{TS}}\right) + \cos\left(2\pi\frac{f_1}{3f_{TS}}\right) + \cos\left(2\pi\frac{2f_1}{3f_{TS}}\right)\right) - s_z\right|,$$

where $$s_q = \frac{\sqrt{3}}{3} \cdot (s_{120} - s_{240}),$$

$$s_d = \frac{2 \cdot s_0 - s_{120} - s_{240}}{3},$$

$$s_Z = \frac{s_0 + s_{120} + s_{240}}{3},$$

and $s_0$, $s_{120}$, and $s_{240}$ are the three equidistant samples respectively.

7. The method of claim 6, wherein the expression (17) for the frequency ($f_1$) is calculated according to the Newton-Raphson iterative method, where $$f_1 = f_{TS} - \frac{G(f_1)}{\frac{d}{df}G(f_1)}, \text{ and where} \quad (19)$$

$$\frac{d}{df}G(f_1) = \quad (18)$$
$$\frac{2\pi A_1}{3 f_{TS}} \cdot \left(\sin\left(2\pi \cdot \frac{f_1}{f_{TS}}\right) + \frac{1}{3}\sin\left(2\pi \cdot \frac{f_1}{3 \cdot f_{TS}}\right) + \frac{2}{3} \cdot \sin\left(2\pi \cdot \frac{2f_1}{3 \cdot f_{TS}}\right)\right)$$

the expression in (19) being computed for $f_1$, the computed $f_1$ replacing $f_{TS}$ in expression (19) in subsequent iterations which are repeated until a predetermined accuracy is obtained.

8. The method of claim 5, wherein the frequency ($f_1$) is determined according to the following expression $$f_1 = f_{TS} \cdot \frac{3}{2 \cdot \pi} \cdot acos\left(\frac{s_{120} + s_{240}}{2 \cdot s_0}\right), \quad (29)$$

where $f_{TS}$ is the frequency of the tracking signal obtained from a previous prediction period or selected on start-up according to an expected frequency of the power system, the phase-difference ($\Phi_{Diff}$) is determined according to the following expression $$\Phi_{Diff} = atan\left(\frac{1 - \frac{s_0}{s_{120}} \cdot \sin\left(\frac{2\pi}{3}\frac{f_1}{f_{TS}}\right)}{\frac{s_0}{s_{120}} \cdot \cos\left(\frac{2\pi}{3}\frac{f_1}{f_{TS}}\right)}\right), \quad (38)$$

the amplitude ($A_1$) is determined according to the following expression $$A_1 = \frac{s_0}{\cos(\Phi_{Diff})}, \text{ where} \quad (39)$$

$$s_q = \frac{\sqrt{3}}{3} \cdot (s_{120} - s_{240}),$$

$$s_d = \frac{2 \cdot s_0 - s_{120} - s_{240}}{3},$$

$$s_z = \frac{s_0 + s_{120} + s_{240}}{3},$$

and $s_0$, $s_{120}$, and $s_{240}$ are the three equidistant samples respectively.

9. The method of claim 5, wherein the frequency ($f_1$) is determined according to the following expression $$f_1 = f_{TS} \cdot \frac{3}{2 \cdot \pi} \cdot acos\left(\frac{s_{120} + s_{240}}{2 \cdot s_0}\right), \quad (29)$$

where $f_{TS}$ is the frequency of the tracking signal obtained from a previous prediction period or selected on start-up according to an expected frequency of the power system, the amplitude ($A_1$) is determined according to the following expression $$A_1 = \sqrt{s_d^2 + s_q^2}, \quad (13)$$

the phase-difference ($\Phi_{Diff}$) is determined according to the following expression $$\Phi_{Diff} = a\tan\left(\frac{s_q}{s_d}\right), \text{ where} \quad (14)$$

$$s_q = \frac{\sqrt{3}}{3} \cdot (s_{120} - s_{240}),$$

$$s_d = \frac{2 \cdot s_0 - s_{120} - s_{240}}{3},$$

$$s_z = \frac{s_0 + s_{120} + s_{240}}{3},$$

and $s_0$, $s_{120}$, and $s_{240}$ are the three equidistant samples respectively.

10. A synchronization system, comprising:
a processor operably connected to a memory for storing data and instructions, the processor being configured to:
  extract from the input signal, three substantially equidistant samples from a fundamental component of the input signal, the three substantially equidistant samples being taken substantially 120 degrees apart during steady-state operation;
  determine a frequency ($f_1$), an amplitude ($A_1$), and a phase-difference ($\Phi_{Diff}$) of the input signal from the three equidistant samples and a tracking signal corresponding to a steady-state of the fundamental component of the input signal characterized by a frequency ($f_{TS}$) and an amplitude ($A_{TS}$) with a phase-difference that is the phase angle between the tracking signal and the input signal; and
  generate and output frequency, amplitude, and phase-difference signals corresponding to the determined frequency ($f_1$), amplitude ($A_1$), and phase-difference ($\Phi_{Diff}$) of the input signal to one or more components of the power system,
wherein the processor is further configured to generate a control signal for adjusting the tracking signal to match the determined frequency ($f_1$), amplitude ($A_1$), and phase-difference ($\Phi_{Diff}$) of the input signal, the synchronization system further comprising a signal generator for generating a synchronization signal from the determined frequency ($f_1$) for output to the one or more components of the power system.

11. The synchronization system of claim 10, wherein the processor is further configured to receive a phase-offset signal including user-specified phase-offset ($\Phi_{USPO}$) relative to a reference-point from an external user system, the frequency ($f_1$), amplitude ($A_1$), and phase-difference ($\Phi_{Diff}$) being determined from the three equidistant samples, the phase-offset signal, and the tracking signal.

12. The synchronization system of claim 11, wherein the reference-point is a positive zero crossing or a positive peak of the input signal, the synchronization signal being aligned with the positive zero crossing or the positive peak.

13. The synchronization system of claim 12, wherein the reference-point is a positive peak of the input signal, the synchronization signal being aligned with the positive peak.

14. The synchronization system of claim 13, wherein the input signal is one of an alternating current (AC) voltage signal and an AC current signal.

15. The synchronization system of claim 14, wherein the amplitude ($A_1$) is determined according to the following expression $$A_1 = \sqrt{s_d^2 + s_q^2}, \quad (13)$$

the phase-difference ($\Phi_{Diff}$) is determined according to the following expression $$\Phi_{Diff} = a\tan\left(\frac{s_q}{s_d}\right), \quad (14)$$

and the frequency ($f_1$) is determined according to the following expression $$G(f_1) = \left| \frac{A_1}{3}\left(\cos\left(2\pi \frac{f_1}{f_{TS}}\right) + \cos\left(2\pi \frac{f_1}{3 f_{TS}}\right) + \cos\left(2\pi \frac{2 f_1}{3 f_{TS}}\right)\right) - s_z \right| \text{ where} \quad (17)$$

$$s_q = \frac{\sqrt{3}}{3} \cdot (s_{120} - s_{240}),$$

$$s_d = \frac{2 \cdot s_0 - s_{120} - s_{240}}{3},$$

$$s_z = \frac{s_0 + s_{120} + s_{240}}{3},$$

and $s_0$, $s_{120}$, and $s_{240}$ are the three equidistant samples respectively.

16. The synchronization system of claim 15, wherein the expression (17) for the frequency ($f_1$) is calculated according to the Newton-Raphson iterative method, where $$f_1 = f_{TS} - \frac{G(f_1)}{\frac{d}{df} G(f_1)}, \quad (19)$$

and where $$\frac{d}{df_1} G(f_1) = \frac{2\pi A_1}{3 f_{TS}} \cdot \left(\sin\left(2\pi \cdot \frac{f_1}{f_{TS}}\right) + \frac{1}{3}\sin\left(2\pi \cdot \frac{f_1}{3 \cdot f_{TS}}\right) + \frac{2}{3}\sin\left(2\pi \cdot \frac{2 f_1}{3 \cdot f_{TS}}\right)\right), \quad (18)$$

the expression in (19) being computed for $f_1$, the computed $f_1$ replacing $f_{TS}$ in expression (19) in subsequent iterations which are repeated until a predetermined accuracy is obtained.

17. The synchronization system of claim 14, wherein the frequency ($f_1$) is determined according to the following expression $$f_1 = f_{TS} \cdot \frac{3}{2 \cdot \pi} \cdot a\cos\left(\frac{s_{120} + s_{240}}{2 \cdot s_0}\right), \quad (29)$$

where $f_{TS}$ is the frequency of the tracking signal obtained from a previous prediction period or selected on start-up according to an expected frequency of the power system,
the phase-difference ($\Phi_{Diff}$) is determined according to the following expression $$\phi_{Diff} = a\tan\left(\left|\frac{1 - \frac{s_0}{s_{120}} \cdot \sin\left(\frac{2\pi}{3} \frac{f_1}{f_{TS}}\right)}{\frac{s_0}{s_{120}} \cdot \cos\left(\frac{2\pi}{3} \frac{f_1}{f_{TS}}\right)}\right|\right), \quad (38)$$

the amplitude ($A_1$) is determined according to the following expression $$A_1 = \frac{s_0}{\cos(\phi_{Diff})}, \quad (39)$$

where $$s_q = \frac{\sqrt{3}}{3} \cdot (s_{120} - s_{240}),$$

$$s_d = \frac{2 \cdot s_0 - s_{120} - s_{240}}{3},$$

$$s_z = s_0 + s_{120} + s_{240},$$

and $s_0$, $s_{120}$, and $s_{240}$ are the three equidistant samples respectively.

18. The synchronization system of claim 14, wherein the frequency ($f_1$) is determined according to the following expression $$f_1 = f_{TS} \cdot \frac{3}{2 \cdot \pi} \cdot a\cos\left(\frac{s_{120} + s_{240}}{2 \cdot s_0}\right), \quad (29)$$

where $f_{TS}$ is the frequency of the tracking signal obtained from a previous prediction period or selected on start-up according to an expected frequency of the power system, the amplitude ($A_1$) is determined according to the following expression $$A_1 = \sqrt{s_d^2 + s_q^2}, \quad (13)$$

the phase-difference ($\Phi_{Diff}$) is determined according to the following expression $$\Phi_{Diff} = a\tan\left(\frac{s_q}{s_d}\right), \quad (14)$$

where $$s_q = \frac{\sqrt{3}}{3} \cdot (s_{120} - s_{240}),$$

$$s_d = \frac{2 \cdot s_0 - s_{120} - s_{240}}{3},$$

$$s_z = s_0 + s_{120} + s_{240},$$

and $s_0$, $s_{120}$, and $s_{240}$ are the three equidistant samples respectively.

19. The synchronization system of claim 18, wherein the processor is a microprocessor or a field programmable gate array.

20. The synchronization system of claim 18, further comprising a phased locked loop (PLL) operably connected to the processor to adjust the tracking signal to match the determined frequency ($f_1$), amplitude ($A_1$), and phase-difference ($\Phi_{Diff}$) of the input signal.

21. A method for use in a synchronization system having a processor operably connected to a memory for synchronizing an input signal for a power system, comprising:
  extracting from the input signal received from the power system, three substantially equidistant samples from a fundamental component of the input signal, the three substantially equidistant samples being taken substantially 120 degrees apart during steady-state operation;
  determining a frequency ($f_1$), an amplitude ($A_1$), and a phase-difference ($\Phi_{Diff}$) of the input signal from the three equidistant samples and a tracking signal corresponding to a steady-state of the fundamental component of the input signal characterized by a frequency ($f_{TS}$) and an amplitude ($A_{TS}$) with a phase-difference that is the phase angle between the tracking signal and the input signal; and
  generating and outputting frequency, amplitude, and phase-difference signals corresponding to the determined frequency ($f_1$), amplitude ($A_1$), and phase-difference ($\Phi_{Diff}$) of the input signal to one or more components of the power system,
  wherein the method has a response time in the synchronization system of two cycles or less of the fundamental component of the input signal.

22. The method of claim 21, wherein the method is operable with the input signal having a frequency range from 1 Hz to 2 kHz, an amplitude from 4% to 100% of a nominal value of the input signal, and superimposed with noise up to 60% of the amplitude of the fundamental component of the input signal.

23. A synchronization system, comprising:
  a processor operably connected to a memory for storing data and instructions, the processor being configured to:
    extract from the input signal, three substantially equidistant samples from a fundamental component of the input signal, the three substantially equidistant samples being taken substantially 120 degrees apart during steady-state operation;
    determine a frequency ($f_1$), an amplitude ($A_1$), and a phase-difference ($\Phi_{Diff}$) of the input signal from the three equidistant samples and a tracking signal corresponding to a steady-state of the fundamental component of the input signal characterized by a frequency ($f_{TS}$) and an amplitude ($A_{TS}$) with a phase-difference that is the phase angle between the tracking signal and the input signal; and
    generate and output frequency, amplitude, and phase-difference signals corresponding to the determined frequency ($f_1$), amplitude ($A_1$), and phase-difference ($\Phi_{Diff}$) of the input signal to one or more components of the power system,
  wherein the system has a response time of two cycles or less of the fundamental component of the input signal.

24. The system of claim 23, wherein the system is operable with the input signal having a frequency range from 1 Hz to 2 kHz, an amplitude from 4% to 100% of a nominal value of the input signal, and superimposed with noise up to 60% of the amplitude of the fundamental component of the input signal.

* * * * *